United States Patent
Belcea

(10) Patent No.: US 7,117,137 B1
(45) Date of Patent: Oct. 3, 2006

(54) ADAPTIVE TRAIN MODEL

(75) Inventor: John Belcea, West Melbourne, FL (US)

(73) Assignee: GE Harris Railway Electronics, LLC, Melbourne, FL (US)

( * ) Notice: Subject to any disclaimer, the term of this patent is extended or adjusted under 35 U.S.C. 154(b) by 795 days.

(21) Appl. No.: 09/752,276

(22) Filed: Dec. 29, 2000

Related U.S. Application Data

(60) Provisional application No. 60/173,602, filed on Dec. 29, 1999.

(51) Int. Cl.
*G06G 7/48* (2006.01)
*G06F 17/10* (2006.01)
*G05B 19/18* (2006.01)

(52) U.S. Cl. .................. 703/8; 703/2; 703/7; 700/9
(58) Field of Classification Search .............. 703/2, 703/7, 8; 700/9
See application file for complete search history.

(56) References Cited

U.S. PATENT DOCUMENTS

| | | | |
|---|---|---|---|
| 5,361,201 A | 11/1994 | Jost et al. | |
| 5,456,604 A | 10/1995 | Olmsted et al. | |
| 5,507,457 A | 4/1996 | Kull | |
| 5,581,472 A | 12/1996 | Miller et al. | |
| 5,651,517 A | 7/1997 | Stevens et al. | |
| 5,659,204 A | 8/1997 | Miller et al. | |
| 5,740,029 A | 4/1998 | Ferri et al. | |
| 5,740,547 A | 4/1998 | Kull et al. | |
| 5,744,707 A * | 4/1998 | Kull .................. | 73/121 |
| 5,813,635 A | 9/1998 | Fernandez | |
| 5,836,529 A | 11/1998 | Gibbs | |
| 5,969,643 A | 10/1999 | Curtis | |
| 5,986,577 A | 11/1999 | Bezos | |
| 6,026,397 A | 2/2000 | Sheppard | |
| 6,112,126 A | 8/2000 | Hales et al. | |
| 6,119,103 A | 9/2000 | Basch et al. | |
| 6,144,901 A | 11/2000 | Nickles et al. | |
| 6,223,114 B1 * | 4/2001 | Boros et al. .................. | 701/70 |
| 6,263,266 B1 | 7/2001 | Hawthorne | |

OTHER PUBLICATIONS

Gruber, P. et al., "Suboptimal Control Strategies for Multilocomotive Powered Trains". IEEE Transactions on Automatic Contol. Jun. 1982. vol. 27, Issue 3, pp. 536-546.*
Claerbout. PVI Table of Contents and "Spectral Factorization". Earth Soundings Analysis: Processing versus Inversion (PVI). © 1992. Posted on Internet Oct. 21, 1998. http://sepwww.stanford.edu/sep/prof/pvi/toc_html/index.html.*
Claerbout. "Confidence Intervals" and "Data Modeling by Least Squares". Fundamentals of Geophysical Data Processing (FGDP). © 1976. Posted on Internet Oct. 21, 1998.*
Thalen, G.A. "An Automatic Speed Enforcement System for Heavy Freight Trains." 1990 ASME/IEEE Joint Railroad Conference. Apr. 1990. pp. 31-39.*
Schmidt, Bruno. "The Least Squares Method Applied to Accident Reconstruction". © 1995-1999. http://www.tarorigin.com/art/Bschmidt/LstSqr/.*
Bentley, J. "An Introduction to Train Brakes." © 1995-1999. http://www.tarorigin.com/art/Jbentley.*
Luczak, M. "You Can't Manage What You Can't Measure." Railway Age. Oct. 2000. http://www.railwayage.com/oct00/fault_detection.html.*

* cited by examiner

*Primary Examiner*—Paul Rodriguez
*Assistant Examiner*—Ayal Sharon
(74) *Attorney, Agent, or Firm*—Armstrong Teasdale LLP

(57) ABSTRACT

An adaptive train model (ATM) for predicting train consist reactions to specific stimuli using a system including at least one measurement sensor located on the train consist, a data base, and a computer. The ATM collects sensor data as the consist is moving, determines a consist force balance utilizing the sensor data and the computer, determines a set of consist coefficients using the computer, and predicts train consist kinetic characteristic values using the consist force balance and the set of consist coefficients.

43 Claims, 5 Drawing Sheets

ADAPTIVE TRAIN MODEL

CROSS REFERENCE TO RELATED APPLICATIONS

This application claims the benefit of U.S. Provisional Application No. 60/173,602, filed Dec. 29, 1999, which is hereby incorporated by reference in its entirety.

BACKGROUND OF THE INVENTION

This invention relates generally to predictive modeling, and more particularly to predicting train consist reactions to specific stimuli.

Typically, when a train consist moves from one location to another, knowledge of the effects of incurred stimuli of the consist as the consist moves along the tracks is useful for increasing the efficiency consist movement. Therefore, a train consist predictive model would aid railroad transportation companies in improving operations. However, modeling the movement of a train consist is complex and time consuming.

Therefore, it would be desirable to provide an effective method of modeling movement of a train consist so that kinetic characteristics, such as stopping distance, speed, and acceleration can be determined and utilized to improve the movement of freight from one location to another.

BRIEF SUMMARY OF THE INVENTION

In an exemplary embodiment, an adaptive train model (ATM) includes a semi-empirical mathematical model of a moving train consist used for simulating and predicting train reaction to external stimuli. The consist includes at least one locomotive and at least one railcar. The ATM utilizes a system including at least one sensor located on the train consist, a database, and a computer.

More particularly, the ATM is used for predicting such things as, train acceleration, train speed after one minute, and a shortest braking distance of the train consist. The model is adaptive because it is built and updated while the train is moving. The model has a set of unknown parameters that are updated as the train consist is moving and new data are collected. Then, based on the most recently measured data, those parameters are used for predicting movement characteristics of the train consist.

DETAILED DESCRIPTION OF THE INVENTION

As used herein, the terms "train consist" and "consist" mean a train having at least one locomotive and at least one railcar. However, a "consist" may include a plurality of locomotives physically connected together with one locomotive designated as a lead locomotive and other locomotives designated as trailing locomotives, and a combination of railcars (freight, passenger, bulk) physically connected to the locomotives.

Figure 1:
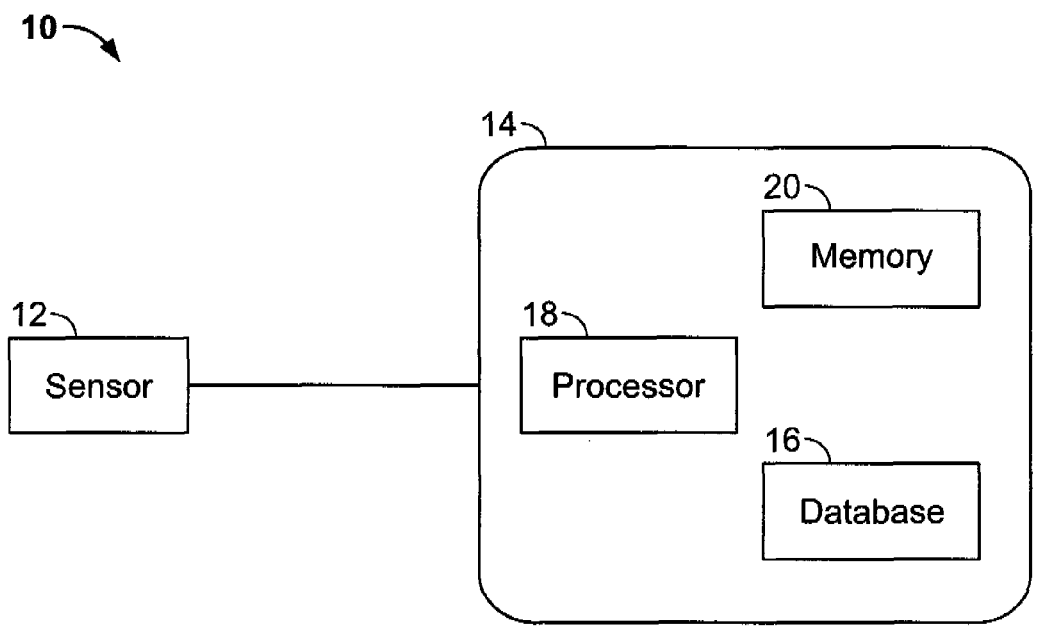
FIG. 1 is a schematic of a system used to implement an adaptive train model (ATM) in accordance with one embodiment of the present invention.

FIG. 1 is a schematic of a system 10 used to implement an adaptive train model in accordance with one embodiment of the present invention. System 10 includes at least one sensor 12 located on a railcar (not shown) of a train consist (not shown), and a computer 14. Computer 14 includes a database 16, a processor 18 capable of executing all functions of computer 14 and a memory 20 sufficient to hold data and algorithms used to implement the adaptive train model. Although system 10 is shown having only one sensor 12, system 10 may include a plurality of sensors 12. Sensor 12 monitors known train consist stimuli relating to moving train consist kinetics, such as, speed, pressure in consist brake pipe, consist position on a track, track configuration, rolling forces, aerodynamic forces, elevation caused forces, braking forces caused by direction changes, and braking forces caused by application of railcar brake shoes (not shown). Sensor 12 communicates stimuli data to computer 14, which uses processor 18 to interpret the stimuli data. Processor 18 utilizes a modeling algorithm, described below and hereinafter referred to as an adaptive train model (ATM), to process the stimuli data, thereby producing coefficients and operational data that are used simulate train consist kinetic characteristics and predict train consist movement. In one embodiment, the coefficients and operational data are stored in memory 20. In an alternative embodiment, the coefficients and operational data are stored in database 16 according the ATM.

The ATM is a semi-empirical model using a set of initially unknown coefficients. Those coefficients are determined and adjusted based on the most recent collected stimuli data and train reaction to those stimuli, such as acceleration. Once determined, the coefficients are used for predicting train kinetic characteristics for a period of time. The ATM is semi-empirical because it takes in account the most important elements of consist kinetics but considers as unknown their interaction. The ATM makes the assumption that the train consist length is constant, the load the consist is carrying is uniformly distributed along the consist, the brakes on all railcars have the same unknown efficiency, and the spiral curvature (1/R) of the track has a linear variation with distance.

Table 1, below, defines the notations that will be used to describe the ATM and how the notations are used to predict consist kinetic characteristics.

TABLE 1

| Symbol | Meaning | Unit |
|---|---|---|
| a | Acceleration | feet/s$^2$ |
| a(t) | Acceleration as a function of time | feet/s$^2$ |
| B$_i$(t) | brake functions | feet/s$^2$ |
| C$_l$(t) | Braking effect caused by lateral friction when train is in curve | feet |
| C$_p$(t) | Braking effect caused by weight increase when train is in curve | feet |
| D | distance | feet |
| D(t) | dynamic brake | pounds |
| D$_C$ | degree of a curve (angle for 100 feet of track)[1] | degrees |
| E$_i$(t) | Elevation function | Feet |
| F | Force | pounds |
| g | Gravitational acceleration (9.82 m/s$^2$ = 32.218 feet/s$^2$) | Feet/s$^2$ |
| K$_a$ | Corrective factor for the effect of aerodynamic friction | lbs/feet |
| K$_{bi}$ | brake function coefficients | no unit |
| K$_d$ | Corrective factor for the effect of dynamic brake application | no unit |
| K$_{ei}$ | Corrective factor for the effect of elevation change on segment i of the train | s$^{-2}$ |
| K$_l$ | Corrective factor for the effect of lateral friction when train is in curve | s$^{-2}$ |
| K$_p$ | Corrective factor for weight increase when train is in curve | s$^{-2}$ |
| K$_r$ | Corrective factor for friction of a train rolling on straight horizontal track | feet/s$^2$ |
| K$_{ri}$ | release function coefficient | no unit |
| K$_{rv}$ | Dynamic corrective factor for friction of a train rolling on straight horizontal track | s$^{-1}$ |
| K$_t$ | Corrective factor for the effect of throttle application | no unit |
| L | total train length | feet |
| L$_i$ | length of segment i | feet |
| l$_{ij}$ | length of the segment i section j of the train | feet |
| M | total train mass | lbs |
| M$_i$ | mass of segment i | |
| m$_{ij}$ | mass of the segment i section j of the train | lbs |
| N$_{ax}$ | Number of powered axles | |
| p(t) | Pressure in brake pipe measured at front locomotive | psi |
| P$_{max}$ | Maximum pressure in brake pipe | psi |
| R | curve radius | feet |
| R$_i$(t) | release functions | feet/s$^2$ |
| L | train length | feet |
| T(t) | traction force | pounds |
| v | speed | feet/s |
| v(t) | speed as function of time | feet/s |
| vd | speed recorded in database | feet/s |
| W | total train weight | lbs |
| w$_{ij}$ | weight of the segment i section j of the train | lbs |

[1]The field CURVE in track database.

Model Description

The ATM determines the train kinetic elements based on a force balance. As the train moves, there are forces pulling the train forward and other forces pulling the backward. The forward forces accelerate the train movement, while the backward forces have a braking effect and create a deceleration. The effect of the vertical forces are considered only as an element affecting the rolling friction of the consist.

In an exemplary embodiment, a balance of forces applied to a consist at time t is $$F(t)=M(K_r+K_{rv}v(t))+K_av(t)^2+MK_{e1}E_1(t)+MK_{e2}E_2(t)+MK_{e3}E_3(t)+MK_{e4}E_4(t)+MK_pC_p(t)+MK_lC_l(t)+K_{b1}B_1(t)+K_{b2}B_2(t)+K_{b3}B_3(t)+K_{b4}B_4(t)+K_{r1}R_1(t)+K_{r2}R_2(t)+K_{r3}R_3(t)+K_{r4}R_4(t)+K_dD(t)+K_tT(t).$$ (1)

The meaning of the function and coefficients is described below.

A rolling forces term, $M(K_r+K_{rv}v(t))$, is the sum of all forces that act on a train moving along an ideal straight horizontal line when no brake or throttle is applied. Those forces can be determined on each independent railcar. They are caused by the friction between rail and wheels, rail elastic deformation under railcar weight, deformation (compression) of the rail understructure caused by railcar weight, bearing friction, and other forces in direct relation with the railcar weight and railcar speed. Adding the effect of all railcars, gives a force that is dependent on train total mass and speed.

$K_r$ is the only coefficient in the ATM that does not have an associated element. $K_{rv}$ is associated with train speed. As the consist speed changes, $K_{rv}v$ modifies the value of the rolling forces.

Aerodynamic forces are expressed by the term, $K_a v(t)^2$. The aerodynamic forces are caused by the friction between the moving train consist and the stationary air. The total force depends on locomotive aerodynamic profile, railcar aerodynamic profiles and the sequence of different railcar types along the consist, such as, flat bed, single stacked, double stacked, caboose, gondola, etc. For such reason the value of the coefficient should be different from one consist to another as each consist has its own aerodynamic profile.

Elevation caused forces are expressed by $M(K_{e1}E_1(t)+K_{e2}E_2(t)+K_{e3}E_3(t)+K_{e4}E_4(t))$. It is assumed that the consist has up to four segments, each uniformly loaded. This assumption is important for modeling the movement of very long consists, where distribution of weight has an important contribution on the speed determination. The size of each segment is determined from loading information provided in a consist description. If such information does not exist, all four segments are considered to be of equal length. For small consists (less than 20 railcars) or uniformly loaded consists, such as coal, ore or other specialized consists, the whole train is considered as one segment.

As a train travels over hills and valleys, some sections of the train are moving uphill, while other train sections are rolling downhill.

A force $f_{ij}$ created by section j of segment i of the consist is tangential to the ground and has the value $$f_{ij}=w_{ij}\cos(\pi/2-\alpha_{ij}).$$ (2)

Factor $w_{ij}$ is the weight of consist section j of segment i. Since the load is assumed to be distributed uniformly along the segment, the weight of the section j of segment i should be $$w_{ij}=M_jgl_{ij}/L_j.$$ (3)

Then an elevation effect on consist section j of segment i is $$f_{ij}=M_jgl_{ij}/L_j\cos(\pi/2-\alpha_{ij}).$$ (4)

Values $1_{ij}$ are the "footage" determined by a track database using two successive elevation records. The first and the last sections of the consist should be determined according to the position of the head and the tail of the train with respect with the surrounding terrain. As the train travels, the size of the train sections are changing continuously, thus they are time dependent. Constraint $$L_i = \sum_{j=1}^{n} l_{ij}(t) \quad (5)$$

is verified at each moment t. The value of $\cos(\pi/2-\alpha_{ij})$ is approximately the same as the value of the field "slope" in a track database divided by 100.

$E_i(t)$ is determined by $$E_i(t) = \sum_{j=1}^{n} l_{ij}(t) \text{ slope}_{ij}/100 \text{ DB\_DIRECTION.} \quad (6)$$

The DB_DIRECTION factor defines the vertical direction each segment of the consist is moving. If the segment is on a downhill slope, DB_DIRECTION is set to negative one (−1), otherwise its value is one (1).

Term $g\, M_i/L_i$ is a constant that was not included in (6). Thus, value of $K_{ei}$ should be $g\, M_i/L_i$, giving $$K_{ei} = gM_i/L_i. \quad (7)$$

From equation (7)

$$K_{ei}L_i/g = M_i, \text{ and} \quad (8)$$

$$\sum_{i=1}^{4} K_{ei}L_i = Mg = W. \quad (9)$$

Noise associated with the data collection and database inconsistencies are not considered, therefore, the sum is an approximation of train weight.

Braking forces caused by direction change are expressed by the term $M\,(K_p\,C_p(t)+K_1\,C_1(t))$. Each change in track direction has three distinctive segments, the entry easement, the circular curve and the exit easement. The entry easement is a spiral with the curvature varying from 0 to a final value of 1/R. In other words, the radius of the turn varies along the easement from ∞ to R. The curve is a circle with a constant radius of R. The exit easement is symmetrical to the entry easement. It starts with radius R and ends with a radius equal with ∞. When a railcar is moving at constant speed along the circular section of the track, it is affected by the centrifugal acceleration determined by $$F_c = mv^2/R. \quad (10)$$

When the railcar is moving along a straight track, 1/R is zero and the centrifugal force is nonexistent. The reason for building the entry end exit easements is to prevent the centrifugal force discontinuities from zero to the value created by the movement on circular track. Radius R is determined by using a $D_C$ field from track database, giving $$R = 180/\pi 100/D_C = 5729.58/D_C. \quad (11)$$

The centrifugal force is compensated for by raising the outer rail of the track, thereby tilting the railcar inward. The point of the railcar center of gravity O depends on the level of railcar loading and the type of load. There are two main forces acting on a railcar moving on a circular track, a railcar weight (w) and a centrifugal force ($F_c$). The centrifugal force is dependent on railcar mass, speed and track curvature. The railcar weight is dependent on railcar mass and gravitational acceleration. These two forces are composed into a resultant (w'). In order to prevent train derailment, the position of this force should always be between the two rails. Therefore, $$w' = sqrt(w^2 + F_c^2), \text{ and} \quad (12)$$

$$w' = msqrt(g^2 + (v^2/R)^2) = msqrt((Rg)^2 + v^4)/R. \quad (13)$$

The ideal position of this force is perpendicular to the track. Such position corresponds to a speed vd recorded in the data base for that particular curve and is strictly related with the amount of superelevation. The force w' is decomposed in two components, one is perpendicular to the track ($F_p$), while the other is parallel to the track ($F_1$). The component perpendicular to the track is the "apparent" weight of the railcar and the component parallel to the track creates lateral friction. Therefore, $$F_p = w'\cos(\theta) = msqrt((Rg)^2 + v^4)\cos(\theta)/R, \text{ and} \quad (14)$$

$$F_1 = w'\sin(\theta) = msqrt((Rg)^2 + v^4)\sin(\theta)/R. \quad (15)$$

The angle θ' is between forces w and w', giving $$\tan(\theta') = F_c/w = (mv^2/R)/(mg) = v^2/(Rg). \quad (16)$$

Θ is the superelevation angle and should be equal to the angle between forces $F_p$ and w. The superelevation angle should satisfy the relation $$\tan(\Theta) = vd^2/(Rg), \quad (17)$$

$$\sin(\Theta) = vd^2/sqrt((Rg)^2 + vd^4); \cos(\Theta) = Rg/sqrt((Rg)^2 + vd^4), \text{ and} \quad (18)$$

$$\sin(\theta') = v^2/sqrt((Rg)^2 + v^4); \cos(\theta') = Rg/sqrt((Rg)^2 + v^4). \quad (19)$$

The angle θ is the difference θ'−Θ. Therefore, $$\cos(\theta) = \cos(\theta' - \Theta) = \cos(\theta')\cos(\Theta) + \sin(\theta')\sin(\Theta), \text{ and} \quad (20)$$

$$\sin(\theta) = \sin(\theta' - \Theta) = \sin(\theta')\cos(\Theta) - \cos(\theta')\sin(\Theta). \quad (21)$$

Which gives $$\cos(\theta) = ((Rg)^2 + v^2vd^2)/(sqrt((Rg)^2 + vd^4)sqrt((Rg)^2 + v^4)), \text{ and} \quad (22)$$

$$\sin(\theta) = Rg(v^2 - vd^2)/(sqrt((Rg)^2 + vd^4)sqrt((Rg)^2 + v^4)). \quad (23)$$

Replacing the values in (14) and (15), gives $$F_p = m((Rg)^2 + v^2vd^2)/(Rsqrt((Rg)^2 + vd^4)), \text{ and} \quad (24)$$

$$F_1 = mg(v^2 - vd^2)/sqrt((Rg)^2 + vd^4). \quad (25)$$

These two forces are associated to the sections of track that are not tangent (straight). $F_p$ represents the braking force caused by the effect of gravitation and centrifugal acceleration. If the effect of gravitation was already included in rolling forces, the relation in (24) should be adjusted by subtracting m g, giving $$F_p = m(((Rg)^2 + v^2vd^2)/(Rsqrt((Rg)^2 + vd^4)) - g). \quad (26)$$

The effect of all sections of the train that are on a circular track at a moment t is $$F_p = \sum_{i=1}^{n} m_i(((R_ig)^2 + v^2vd_i^2)/(R_isqrt((R_ig)^2 + vd_i^4)) - g), \quad (27)$$

and using (15) gives $$F_1 = \sum_{i=1}^{n} m_i g(v^2 - vd_i^2)/sqrt((R_i g)^2 + vd_i^4). \quad (28)$$

Value $m_i$ is the mass of the train on each circular section i of track. For a uniform train loading the value should be proportional with the section length. The final expression of forces is then given by $$F_p = M/L \sum_{i=1}^{n} l_i(((R_i g)^2 + v^2 vd_i^2)/(R_i \sqcup sqrt((R_i g)^2 + vd_i^4)) - g, \text{ and} \quad (29)$$

$$F_1 = M/L \sum_{i=1}^{n} l_i g(v^2 - vd_i^2)/sqrt((R_i g)^2 + vd_i^4). \quad (30)$$

Similar formulae are associated with forces developed by the train sections in easements. Since the radius of easement is variable, forces associated with easements are considered to be half of the forces created in circular sections. Such a supposition is correct if easements have a linear variation of a curvature 1/R. Removing constant terms, the expression of the "perpendicular force effect" for sections of train located in curve sections of track is $$C_p(t) = \sum_{i=1}^{n} l_i(t)\delta_i(((R_i g)^2 + v^2 vd_i^2)/(R_i sqrt((R_i g)^2 + vd_i^4)) - g), \quad (31)$$

and the "lateral force effect" is $$C_1(t) = \sum_{i=1}^{n} l_i(t)\delta_i(v^2 - vd_i^2)/sqrt((R_i g)^2 + vd_i^4)). \quad (32)$$

where $\delta_i$ are 1 for circular sections and 0.5 for easements.

Braking forces caused by the operation of the consist brakes are expressed by $K_{b1} B_1(t) + K_{b2} B_2(t) + K_{b3} B_3(t) + K_{b4} B_4(t)$. The sum of four terms $K_{bi} B_i(t)$ denote the total braking force applied to the train. The value of this sum will differ from zero only when the brake shoes are pressing the wheels on at least one railcar. After an engineer reduces the pressure in brake pipe, the brake shoes along the consist are successively applied against the wheels increasing the total braking force to a maximum value, railcar by railcar. Although all shoes are pressing the wheels with the maximum force, the total braking force does not remain constant. As the train speed decreases, the friction coefficient between the wheels and shoes changes its value modifying the value of the train total braking force.

The friction coefficient between the wheels and shoes is in direct relation to the material composition of the brake shoes. Brake shoes can be made from cast iron, cast iron with high phosphorous, or high friction composition blend of organic and inorganic materials. In addition, the static and dynamic friction coefficients are different from one shoe type to another. The following formulae determine the friction coefficient.

For cast iron shoes the friction coefficient is, $$C_i = 0.18 + 0.28 * exp(-0.25 * v), \text{ and} \quad (33)$$

For high composition shoes the friction coefficient is, $$C_c = 0.255 + 0.11 * exp(-0.07 * v). \quad (34)$$

Figure 2:
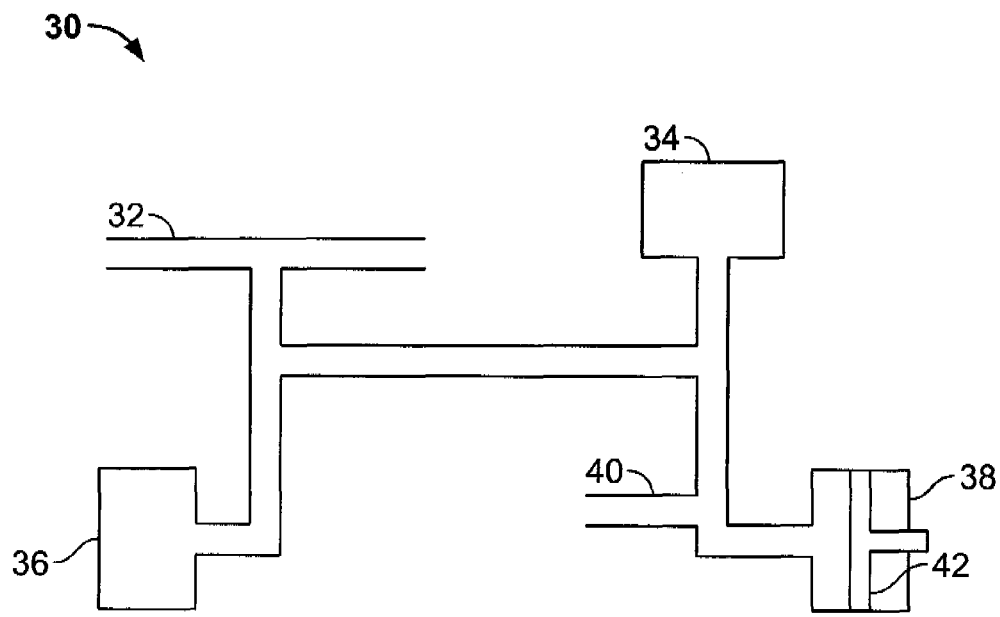
FIG. 2 is a schematic diagram of a compressed air system, with an auxiliary reservoir, used in a train consist utilizing the system shown in FIG. 1.

FIG. 2 is a schematic diagram of a compressed air system 30 for a train consist using an auxiliary reservoir. Compressed air system 30 includes a consist brake pipe 32 that runs the length of the train consist, a main reservoir 34 for storing pressurized air, an auxiliary reservoir 36 for storing auxiliary pressurized air, a brake cylinder 38 that engages and disengages the brake shoes of a railcar (not shown), and an exhaust 40 that allows air to be vented from system 30. Although system 30 is shown having only one brake cylinder 38, each wheel of a railcar is coupled with a brake cylinder 38 such that a respective set of brake shoes are operated for each wheel. Brake application is caused by a reduction of air pressure in consist brake pipe 32. The dragging force created by the brake application is equal to the product between a friction coefficient $C_f(v)$ and a force $f_b(t)$ applied by the brake shoes to the wheels of each railcar, as the pressure builds up in brake cylinders 38. The value of the pressure in brake cylinders 38 relates to a pressure drop in brake pipe 32 $\Delta p$ and an initial pressure in the auxiliary reservoir 36 Pa.

The variation of pressure in brake cylinders 38 depends on a variety of factors, such as, the length of brake pipe 32, air temperature, humidity, the operational status of a brake valve 42, and the amount of slack in the brake shoes. However, there are likely more factors, some unmeasurable or unknown, that effect the pressure in brake cylinder 38. To compensate for variations two models that evaluate the brake cylinder force in two opposite conditions are used, one supposes that the pressure is building fast in brake cylinders 38, while the other considers that the pressure is building much slower. Although, the two pressure models are designed to match the braking force developed by short trains and long trains, their linear combination can mimic the time variation of the braking force for a large variety of trains in many external conditions. The proper combination of those two pressure models with the friction coefficients is a critical task of the Adaptive Train Model.

The model for fast building pressure uses a pressure drop causing equalization $$Ep = (Pa^{1.18285856} + 84.14968969)/12.43010076, \quad (35)$$

a reference pressure $$Rp = min(Ep, \Delta p), \text{ and}$$

a rigging equation $$Rigg = min(0, max(1, (12.4301008 * Rp - 84.1496897)/Pa^{1.18285856})). \quad (36)$$

The rigging value should be between 0 and 1. Therefore, brake cylinder maximum force equals $$Bc_f = (345.0445077 * Rp - 4986.482562) * Rigg, \text{ and} \quad (37)$$

modified time equals $$T = max(0, (t - 2.53325611) * (297.383526/(0.08709894 * L + 1))^{0.77418566} * [1/(-0.02072556 * Pa - 0.00036791 * Pa^2 + 6.47422981) + 1/(-0.004423106 * Rp + 0.00137952 * Rp^2 + 0.02506324)]. \quad (38)$$

If $\Delta p > Ep$, the modified time is replaced by $$T = T^{(1 + 25.2474268(Rp - Ep)/Pa - 148.737743((Rp - Ep)/Pa)2)}. \quad (39)$$

Therefore, the braking force for fast building pressure is given by $$Bf_f=\min(0,\max(1,(T+3.86950758*T^2+ 0.23164628*T^3)/(16367.9101+111.652789*T+ 27.61345048*T^2-0.0026229*T^3)))Bc_f. \quad (40)$$

The model for slow building pressure uses a pressure drop causing equalization $$Ep=(Pa^{1.186922636}+83.5394856)/12.47984, \quad (41)$$

a reference pressure $$Rp=\min(Ep,\Delta p), \text{ and} \quad (42)$$

a rigging equation $$Rigg=\min(0,\max(1,(12.47984*Rp-83.5394856)/ P_a^{1.18692264})). \quad (43)$$

The rigging value should be between 0 and 1. Therefore, brake cylinder force is given by $$Bc_s=(346.46923*Rp-5015.0018)*Rigg, \text{ and} \quad (44)$$

modified time equals $$T=\max(0,(t-4.99998034)*[297.383526/ (0.08709894*L+1)]^{0.77418566}*[1/(- 0.00781443*Pa-0.00034658*Pa^2+6.76259649)+ 1/(0.07532957*Rp+0.0020505*Rp^2+ 0.93285061)]. \quad (45)$$

If $\Delta p > Ep$, the modified time is replaced by $$T_s=T_s^{(1+2.47330639(Rp-Ep)/Pa-8.92733905((Rp-Ep)/Pa)2)}. \quad (46)$$

Therefore, the braking force for slow building pressure is given by $$Bf_s=\min(0,\max(1,(T_s+2.00986206*T_s^2+ 0.81412194*T_s^3)/(0.00067603+169.361303*T_s+ 8.95254599*T_s^2+0.58477705*T_s^3)))Bc_s. \quad (47)$$

Taking into consideration the model for fast building pressure and the model for slow building pressure, the total braking force has four components $B_1=C_iBf_f$,
$B_2=C_cBf_f$,
$B_3=C_iBf_s$, and
$B_4=C_cBf_s$.

The balance of forces equation (1) also takes into consideration the brake release pressures. When an engineer restores the pressure in the brake pipe to the initial value, the brake shoes are removed from wheels and the dragging force created by the brake application decreases. The ATM considers brake release as a force opposing the braking force. The ATM has to identify the proper coefficients such that the release force cancels the brake force when shoes are in fact completely removed from wheels. As in the brake application, two conditions are considered, a fast release model and a slow release model.

The model for fast release utilizes a pressure drop causing equalization $$Ep=(Pa^{1.18285856}+84.14968969)/12.43010076, \quad (48)$$

a reference pressure $$Rp=\min(Ep,\Delta p), \text{ and} \quad (49)$$

a rigging equation $$Rigg=\min(0,\max(1,(12.4301008*Rp-84.1496897)/ P_a^{1.18285856})). \quad (50)$$

The rigging value should be between 0 and 1. Therefore, brake cylinder maximum reference force is given by $$Bc_f=(345.0445077*Rp-4986.482562)*Rigg. \quad (51)$$

Thus, the fast release force is given by $$Rf_f=\min(0,\max(1,(t+3.86950758*t^2+0.23164628*t^3)/ (16367.9101+111.652789*t+27.61345048*t^2- 0.0026229*t^3)))Bc_f. \quad (52)$$

The model for slow release utilizes a pressure drop causing equalization:

$$Ep=(Pa^{1.186922636}+83.5394856)/12.47984, \quad (53)$$

a reference pressure:

$$Rp=\min(Ep,\Delta p), \text{ and}$$

a rigging equation:

$$Rigg=\min(0,\max(1,(12.47984*Rp-83.5394856)/ P_a^{1.18692264})). \quad (54)$$

The rigging value should be between 0 and 1. Therefore brake cylinder reference force:

$$Bc_s=(346.46923*Rp-5015.0018)*Rigg. \quad (55)$$

Thus the slow release force is given by:

$$Rf_s=\min(0,\max(1,(t+2.00986206*t^2+0.81412194*t^3)/ (0.00067603+169.361303*t+8.95254599*t^2+ 0.58477705*t^3)))Bc_s. \quad (56)$$

Taking into consideration the model for fast release and the model for slow release, the total release force has four components $R_1=C_iRf_f$,
$R_2=C_cRf_f$,
$R_3=C_iRf_s$, and
$R_4=C_cRf_s$.

The dynamic brake force is represented by $K_d D(t)$. The value in pounds of D(t) is determined by $$D(t)=I^2v^2N_{ax}/591.43, \quad (57)$$

where I is a current in Amperes, v is a speed in feet/s and $N_{ax}$ is a number of powered axles.

The traction force is represented by $K_t T(t)$, where T(t) is the traction effort and is dependent on locomotive type and train speed. $K_t$ will be one if the train has only one locomotive, the locomotive efficiency is 100% and the locomotive wheels do not slip.

For trains using more than one locomotive type, or not using the same number of locomotives all the time, T(t) will be the sum of traction efforts developed by all active locomotives.

Since a train mass M does not change value during the trip, the relation in (1) is divided by the total train mass. The result is the expression of train acceleration $$a(t)=K_r+K_{rv}v+K_av^2+K_{e1}E_1(t)+K_{e2}E_2(t)+K_{e3}E_3(t)+ K_{e4}E_4(t)+K_pC_p(t)+K_1C_1(t)+K_{b1}B_1(t)+K_{b2}B_2(t)+ K_{b3}B_3(t)+K_{b4}B_4(t)+K_{r1}R_1(t)+K_{r2}R_2(t)+K_{r3}R_3(t)+ K_{r4}R_4(t)+K_dD(t)+K_tT(t). \quad (58)$$

In this relation all current and past values of speed, acceleration, throttle position, pressure in brake pipe, and position on track can be used for determining coefficients $K_i$. Once the coefficients are determined, they can be used for predicting the consist speed, acceleration, and other values at any moment of time.

Determining the Coefficients.

In one embodiment, to determine the coefficients for the ATM, the Least Squares Method (LSM) is utilized. In one embodiment, the behavior of a real world object depends on a set of measurable independent stimuli $x_1, x_2, \ldots x_n$. To any set of stimuli, the object provides a measurable reaction y. Therefore a mathematical relation that approximates the reaction of the object to those stimuli is developed.

The independent set of variables x (stimuli) and the dependent variable y (reaction), are measured. Measuring those variables, m times gives the following table of measurements M:

$$X_{1,1} \; X_{1,2} \; \ldots \; X_{1,a} \; Y_1$$

$$x_{2,1} \quad x_{2,2} \quad \ldots \quad x_{2,n} \quad y_2$$
$$\ldots \quad \ldots \quad \ldots \quad \ldots \quad \ldots$$
$$x_{m,1} \quad x_{m,2} \quad \ldots \quad x_{m,n} \quad y_m.$$

The dependent variable y can be determined by a linear combination of other independent variables x, giving the equation $$y = \sum_{j=1}^{n} a_j x_j. \tag{59}$$

The dimension m of the table is variable. At any time another experiment can be made and the new set of values added to a previously built table.

For any set of chosen or determined values of $a_j$ coefficients an approximation y' is determined. The difference between the measured y and the determined y' is the approximation error $\epsilon$, where $$\varepsilon_i = y_i - \sum_{i=1}^{n} a_j x_{i,j} \text{ for } i = 1, 2, \ldots, n. \tag{60}$$

By choosing different sets of $a_j$ coefficients, the errors $\epsilon_i$ change. In one embodiment, the values of $a_j$ that minimize the expression $$E = \sum_{i=1}^{m} \varepsilon_i^2 = \sum_{i=1}^{m} \left( y_i - \sum_{j=1}^{n} a_j x_{i,j} \right)^2 \tag{61}$$

are calculated. The global error E depends on $a_j$ values only, while all other elements in relation (61) are measured numerical values. Then the partial derivative of E with any $a_k$ will be zero, for example, $$\partial E / \partial a_k = 0 \text{ for } k = 1, 2, \ldots n. \tag{62}$$

Therefore, replacing the value of E from (61) in (62) and differentiating gives the equation $$-2 \sum_{i=1}^{m} \left( \left( y_i - \sum_{j=1}^{n} a_j x_{i,j} \right) \sum_{j=1}^{n} (\partial a_j / \partial a_k x_{i,j}) \right) = 0 \text{ for } k = 1, 2, \ldots n. \tag{63}$$

The term $\partial a_j / \partial a_k$ is 1 when j is equal with k and zero in all other cases. Ignoring the constant term −2 gives the equation $$\sum_{i=1}^{m} \left( \left( y_i - \sum_{j=1}^{n} a_j x_{i,j} \right) x_{i,k} \right) = 0 \text{ for } k = 1, 2, \ldots n. \tag{64}$$

Changing the summation order and moving known elements on the right hand of the equation gives $$\sum_{j=1}^{n} a_j \left( \sum_{i=1}^{m} x_{i,j} x_{i,k} \right) = \sum_{i=1}^{m} y_i x_{i,k} \text{ for } k = 1, 2, \ldots n. \tag{65}$$

Both summations by i are using measured numbers. Those summations provide the matrix that is used for determining the unknown $a_i$ coefficients. Using the notations $$X_{k,j} = X_{j,k} = \sum_{i=1}^{m} x_{i,j} x_{i,k}, \text{ and } Y_k = \sum_{i=1}^{m} y_i x_{i,k}, \tag{66}$$

gives the final form of the system of equations $$\sum_{j=1}^{n} X_{k,j} a_j = Y_k \text{ for } k = 1, 2, \ldots n. \tag{67}$$

The relation (67) is a system of n equations with n unknown variables $a_j$. The matrix of this system X and the right hand term Y are determined from the measured data. The values of unknown coefficients $a_j$ are found by solving the system of equations (67). After determining coefficients $a_j$, the individual error for each measurement is determined using $$\varepsilon_i = y_i - \sum_{j=1}^{n} a_j x_{i,j} \text{ for } i = 1, 2, \ldots m. \tag{68}$$

Replacing the expression of error $e_i$ in (65) gives $$\sum_{i=1}^{m} \varepsilon_i x_{i,k} = 0 \text{ for } k = 1, 2, \ldots n. \tag{69}$$

If one of the $x_{i,j}$ has the value one, then the individual errors also have the property $$\sum_{i=1}^{m} \varepsilon_i = 0. \tag{70}$$

If measurements are not all made in the same conditions, weighting factors reflecting our confidence in the validity of each measurement are used. In such a case, the expression is minimized by $$E = \sum_{i=1}^{m} w_i \varepsilon_i^2 = \sum_{i=1}^{m} w_i \left( y_i - \sum_{j=1}^{n} a_j x_{i,j} \right)^2, \quad (71)$$

where each independent error has a different weight. Additionally, $$X_{k,j} = X_{j,k} = \sum_{i=1}^{m} w_i x_{i,j} x_{i,k}, \text{ and } Y_k = \sum_{i=1}^{m} w_i y_i x_{i,k}. \quad (72)$$

If the approximation has a free term, the property $$\sum_{i=1}^{m} w_i \varepsilon_i = 0 \text{ applies.} \quad (73)$$

The relation (58) defines the train acceleration. The following table is a mapping of the train movement model to least square method notation.

| Train | LSM |
|---|---|
| $K_r$ | $A_0$ |
| 1 | $X_0$ |
| $K_{rv}$ | $A_1$ |
| v | $X_1$ |
| $K_a$ | $A_2$ |
| $v^2$ | $X_2$ |
| $K_{e1}$ | $A_3$ |
| $E_1(t)$ | $x_3$ |
| $K_{e2}$ | $a_4$ |
| $E_2(t)$ | $x_4$ |
| $K_{e3}$ | $a_5$ |
| $E_3(t)$ | $x_5$ |
| $K_{e4}$ | $a_6$ |
| $E_4(t)$ | $x_6$ |
| $K_p$ | $a_7$ |
| $C_p(t)$ | $x_7$ |
| $K_l$ | $a_8$ |
| $C_l(t)$ | $x_8$ |
| $K_{b1}$ | $a_9$ |
| $B_1(t)$ | $x_9$ |
| $K_{b2}$ | $a_{10}$ |
| $B_2(t)$ | $x_{10}$ |
| $K_{b3}$ | $a_{11}$ |
| $B_3(t)$ | $x_{11}$ |
| $K_{b4}$ | $a_{12}$ |
| $B_4(t)$ | $x_{12}$ |
| $K_{r1}$ | $a_{13}$ |
| $R_1(t)$ | $x_{13}$ |
| $K_{r2}$ | $a_{14}$ |
| $R_2(t)$ | $x_{14}$ |
| $K_{r3}$ | $a_{15}$ |
| $R_3(t)$ | $x_{15}$ |
| $K_{r4}$ | $a_{16}$ |
| $R_4(t)$ | $x_{16}$ |
| $K_{b9}$ | $a_{14}$ |
| $R_1(t)$ | $x_{14}$ |
| $K_t$ | $a_{17}$ |
| $T(t)$ | $x_{17}$ |
| acc(t) | |

The measured parameter $x_0$ always has the value 1. Time t is not explicitly used in this model. All $x_j$ values are determined using the latest measured acceleration, speed, train position and pressure in equalizing reservoir 36 shown in FIG. 2.

The X matrix is symmetrical with the positive diagonal. As a result, indefinitely adding elements to the matrix causes data degeneration and loss of precision. In order to prevent data degeneration each measurement is weighted. Thus, the weight of the present measurement is set to one, the weight of the measurement before that is set to a smaller value and the weight of each preceding measurement is set to yet a smaller value.

The value $\epsilon$ is set to a positive number smaller than 1 and the series 1, $(1-\epsilon)$, $(1-\epsilon)^2$, $(1-\epsilon)^3$, . . . converges to zero. By considering the series of weights for consecutive measurements, after an infinite number of measurements, any positive term on the diagonal of the LSM matrix will have a value limited according to the equation, $$x[i, i] \leq \Im^2 \sum_{k=0}^{\infty} (1-\varepsilon)^k = \Im^2 (1-(1-\varepsilon)^{\infty})/(1-(1-\varepsilon)) = \Im^2/\varepsilon, \quad (74)$$

where $\Im$ is the maximum value between one and the largest absolute value of the considered parameter. From (74), applying the weighting procedure presented above to LSM generates a matrix that has all terms on the diagonal smaller than $\Im^2/\epsilon$, where $0<\epsilon<1$. Additionally, equally weighted measurements (corresponding to $\epsilon=0$) create a condition for floating point errors, and that large values of $\epsilon$ (almost one) assure better precision for number representation, but gives too small of a weight to prior samples, practically eliminating them from selection.

The optimal value will be somewhere between zero and one. Using $\epsilon=10^{-3}$ with 32 bit floating point representation provides 4 correct decimal digits. Using $\epsilon=10^{-5}$ with 64 bit floating point representation provides 11 correct decimal digits of the result.

The term x[1,1] is associated to the free term. Without any weighting, this number is equal with the number of samples considered for determination. When using weights, the term is called "the apparent number of samples". Using the weighting procedure the value of x[1,1] converges to $1/\epsilon$.

The sum in (74) is performed for an infinite number of terms and there is no need to store more data than the current evaluated x vector. The weighting of data is realized by "aging" the X matrix and the Y vector before adding the latest collected data. If X(n) is the matrix X for step n and Y(n) is the vector Y in the same step, the next step elements are $$X(n+1)=(1-\epsilon)X(n)+\|x_{n+1,j}x_{n+1,k}\| \text{ for } j,k=1, 2, 3, \ldots$$
$$m, \text{ and } Y(n+1)=(1-\epsilon)Y(n)+y_{n+1}\|x_{n+1,k}\| \text{ for } k+1,$$
$$2, 3, \ldots m. \quad (75)$$

From (75), the following corollary is derived.

If $X(n)$ has the inverse $P(n)$ and $X(n+1)=X(n)+x(n+1)$
$x(n+1)^T$, then $P(n+1)=P(n)-[P(n)x(n+1)][[x(n+1)^T P(n)]/(x(n+1)^T P(n)x(n+1)+1)]$. (76)

However, if there is problem in the initial matrix, X(0) is null and it has no inverse. To overcome this inconvenience without destroying the precision the initial value of X(0) is set to some small values on the diagonal, for example $10^{-5}$, with the rest of the matrix set to zero. During the process the small value is overwritten by larger $x(n)x(n)^T$ values. The inverse of X(0) is P(0) with all elements set to zero except for the diagonal that has the inverse of each element from the diagonal of X(0) divided by m.

A Y vector is updated according to $$Y(n+1)=Y(n)+accx(n+1), \text{ and} \quad (77)$$

the values of $a_j$ coefficients are determined according to $$a(n)=P(n)Y(n). \quad (78)$$

When performing the matrix operations the total number of computer operations is 13 $m^2+2$ m+1. The Gauss-Jordan triangulation method, requires for solving the same problem, $m^3+(m^2-m)/2$ operations.

Model Confidence

All variables in the ATM are independent. Therefore, all coefficients determined will be independent. Thus, the real train behavior and measurements are not affected by large errors, and after a short period of time, the value of each coefficient will be approximately the same from one second to another.

The stability of coefficient values effects the stability of predictions that are provided. One way to measure the quality of information gathered by the model is to monitor the differences between the predicted speed and the measured speed. The speed may be predicted for one minute, 15 seconds, or only one second. The potential disadvantage is that the quality of a prediction at a time after the prediction was actually made is unknown.

For a one second speed prediction the response is available after one second, but is affected by the measurement noise, and the one minute prediction provides a response after one minute, which is too late. A five second or fifteen second prediction is sufficient for judging the quality of model predictions.

Each speed measurement $v_k$ is associated with the value $\overline{v}_k$, predicted a few seconds earlier. For a large set of measurements or predictions the variance $\sigma$ is associated according to the equation, $$\sigma^2 = \sum_{k=1}^{n} (\overline{v}_k - v_k)^2 / (n-1). \quad (79)$$

The only values that have to be stored are n, the sum of the square values $$\sum_{k=1}^{n} (v_k)^2,$$

and the sum of the values $$\sum_{k=1}^{n} v_k.$$

As a new value $\overline{v}_k$ is predicted, it is stored in a circular array from where it is retrieved when the corresponding $v_k$ measurement is available. The differences between the values are used for updating the value of the variance $\sigma^2$. The confidence coefficient is determined as a function of $|(v_k-v_k)/\sigma|$ or $(v_k-v_k)^2/\sigma^2$ in accordance with the following table.

| $|e_k/\sigma|$ | $e_k^2/\sigma^2$ | Confidence (%) |
|---|---|---|
| .0 | .0 | 100.00 |
| .1 | .01 | 92.04 |
| .2 | .04 | 84.14 |
| .3 | .09 | 76.42 |
| .4 | .16 | 68.92 |
| .5 | .25 | 61.7 |
| .7 | .50 | 48.4 |
| 1.0 | 1.0 | 31.74 |
| 1.5 | 2.3 | 13.36 |
| 2.0 | 4.0 | 4.56 |
| 2.5 | 6.3 | 1.24 |
| 3.0 | 9.0 | 0.26 |

The confidence column is determined by the modified ERF function, $$1 - \frac{1}{\sqrt{2\pi}} \int_{-\frac{\varepsilon}{\sigma}}^{+\frac{\varepsilon}{\sigma}} e^{-\frac{t^2}{2}} dt.$$

Value $\varepsilon$ is the absolute value of the difference between the last measured value and the corresponding predicted value. The relation, $$1/(1+0.77439865x+0.80155580x^2+0.54110010x^3+0.030646485x^4),$$

where x is $|e_k/\sigma|$, provides an approximation of the ERF function with errors between $-0.00067$ and $+0.001315$ for $0 \leq x \leq 3.4$.

Predictions

The ATM determines the instantaneous train consist acceleration. Predicted values such as acceleration, speed, and distance are integrated starting with the present position, speed, and acceleration. If all the coefficients are already determined, the equation (58) is written as $$a(t)=\Phi(t). \quad (80)$$

The beginning of the prediction is considered as t=0. The numerical integration is performed in steps. Thus, step i=0 corresponds to t=0, step i=1 corresponds to t=$\Delta$t, and so on. The size of $\Delta$t is capable of being equal to one second, a half second, 0.1 seconds, or smaller and larger values. A better prediction will be provided using a smaller value so that the value $a_0$ equals the acceleration value measured at t=0.

When determining the acceleration, the $\Phi(t)$ function uses two determined values, the current locomotive position and the speed. To maintain consistency with other relations, the function parameter used is i. The notation $\Phi(i)$ represents the value of the function determining the acceleration, using a speed value $v_i$ and a distance $d_i$.

In one embodiment, the speed is determined by utilizing the known Euler method, giving the equation $$v_i=v_{i-1}+\Delta t a_{i-1}. \quad (81)$$

The distance is determined by the speed value at the beginning and the end of the time interval, according to $$d_i=d_{i-1}+\Delta t(v_i+v_{i-1})/2. \quad (82)$$

The acceleration is provided by the relation (58) symbolized as the $\Phi(i)$ function. $\Phi(i)$ uses the new position $d_i$ to identify the length of the consist affected by elevation change and track curvature and the most recent determined $v_i$ speed, accordingly $$a_i=\Phi(i). \tag{38}$$

The acceleration is considered to be constant for the length $\Delta t$. The error in determining the distance $d_n$ is approximately $\Delta t^2\Phi(\tau) d_n/12$ where $0<\tau<n\Delta t$. When $\Phi(t)$ has negative values (braking) a shorter distance is given. Therefore, using the Euler method for approximating the stopping distance, provides smaller values than actual stopping distance.

The relative error of distance determined with the Euler method is proportional with $\Delta t^2$, and requires one evaluation of function $\Phi(i)$ per iteration.

In another embodiment, the speed is determined by using the known Milne method for second degree equations y"=f (x, y, y'). Each integrated parameter is determined twice. A predicted value is determined first and a corrected value is determined second. Thus, the speed prediction is given by, $$v_i=v_{i-4}+4\Delta t(2a_{i-3}-a_{i-2}+2a_{i-1})/3,$$

$$d_i=d_{i-3}+3(d_{i-1}-d_{i-2})+\Delta t^2(a_{i-1}-a_{i-2}), \text{ and}$$

$$a_i=\Phi(i). \tag{84}$$

The correction is given by, $$v_i=v_{i-2}+\Delta t(a_{i-2}+4a_{i-1}+a_i)/3,$$

$$d_i=d_{i-1}+\Delta t(v_i+v_{i-1})/2-\Delta t^2(a_i-a_{i-1})/12, \text{ and}$$

$$a_i=\Phi(i). \tag{85}$$

The Milne method requires two determinations of $\Phi(i)$ function per iteration and the relative error is proportional with $\Delta t^5$.

Initial values, $a_0$, $v_0$, $d_0$, are the last measured values. Additionally, Milne's integration method requires $a_{-1}$, $v_{-1}$, $d_{-1}$, $a_{-2}$, $v_{-2}$, $d_{-2}$, $a_{-3}$, $v_{-3}$, $d_{-3}$, which are the values measured in the last three steps before the integration starts. Since the data collection time interval is one second, $\Delta t$ is one second.

The speed after one minute is determined by using the integration procedure presented in (83). During the integration, the function $\Phi(i)$ is evaluated keeping constant the pressure in the brake pipe and the traction force. Each step of integration determines $a_i$, $v_i$, $d_i$ from previously determined four triplets. The integration continues for sixty steps giving the predicted value of $v_{60}$.

The shortest breaking distance is determined by using the same integration method until the speed $v_n$ becomes zero. During the integration the pressure in brake pipe 32, (shown in FIG. 2), is set to a constant value corresponding to full service brake application and the traction force is set to zero. The integration continues until $v_n \leq 0$, thereby giving the predicted braking distance having a value of $d_n$.

Model Management

Using information from a consist description, default or initial values for model coefficients are determined. The biggest disadvantage of this method is that the errors caused by incorrect or incomplete consist information, do not decrease while new data is collected, so the quality of predictions does not improve with time.

The ATM uses the system of linear equations given above. The system of equations is updated every second with new data about the consist performance. Therefore by solving the system of equations an updated model is given every second.

The normal least squared matrix (LSM) generated for a consist is suitable to be transported and used as initial data on another consist with identical or close characteristics. Information about differences in consist structures is used for reshaping the initial normal matrix.

Figure 3:
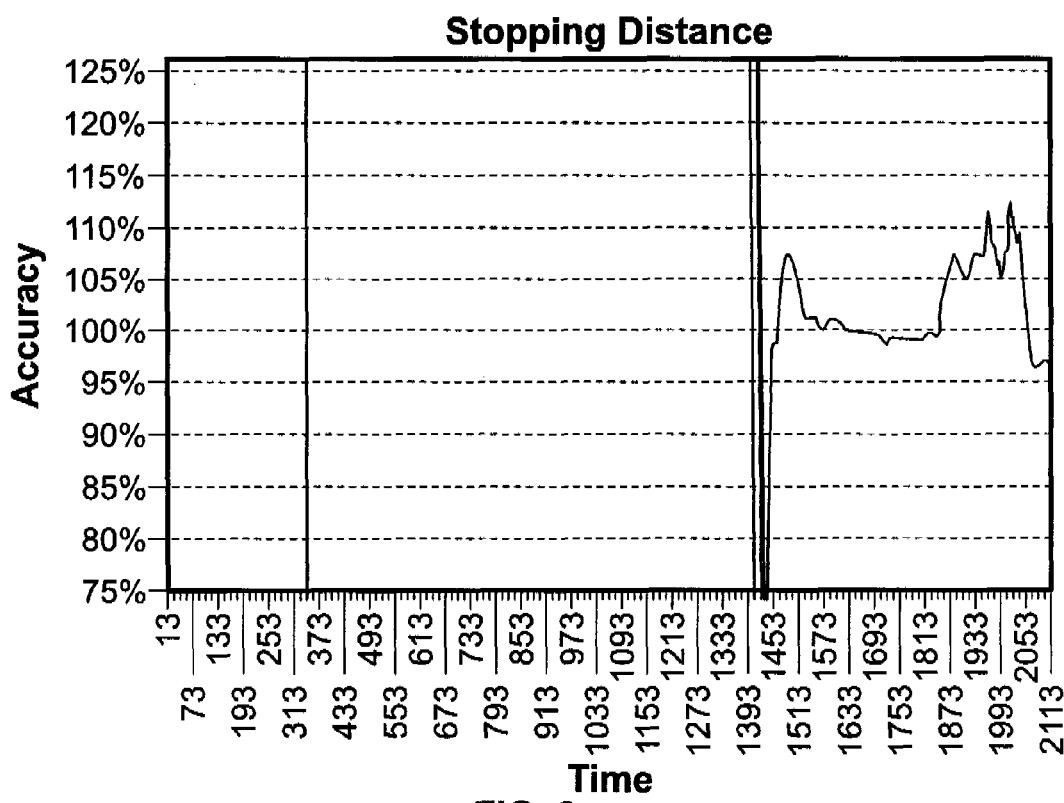
FIG. 3 is a chart depicting the difference between actual stopping distance and the predicted stopping distance determined utilizing the ATM with no initial values.

FIG. 3 is a chart, based on an exemplary embodiment, depicting the difference between actual stopping distance and the predicted stopping distance utilizing the ATM with no initial values. The exemplary embodiment relates to a consist having two locomotives, 50 loaded railcars and 51 empty railcars, the stopping distances are determined by using no initial information. The most important event regarding train movement and data collection are given in the following table. All determinations refer to the same stopping operation. The X axis presents the time or the "age" of the model. The Y axis presents the predicted stopping distance compared with the actual stopping distance. Each prediction is made using the ATM coefficients resulting from data collected prior to the moment of prediction.

| No | Time (sec) | Trip (feet) | Event | Comments |
|---|---|---|---|---|
| 1. | 6 | 0 | Start on notch 1 | Uphill orientation; train is too heavy and moves backward |
| 2. | 36 | −62 | Notch set to 2 | Train keeps moving backward |
| 3. | 66 | −128 | Notch set to 3 | Train starts moving forward after backing up 148 feet. |
| 4. | 126 | −123 | 7 psi brake pipe reduction | Train Speed is about 1 MPH |
| 5. | 176 | −76 | Train stops | Train moved forward for 71 feet of the 148 feet backed up. |
| 6. | 186 | −76 | Release brake | |
| 7. | 186 | −76 | Notch changed from 3 to 5 | Train starts moving forward. |
| 8. | 685 | 8408 | Notch set to 0 | |
| 9. | 685 | 8408 | 7 psi brake pipe reduction | Speed is 17.56 MPH |
| 10. | 716 | 9184 | 10 psi brake pipe reduction | |
| 11. | 746 | 9808 | Release brake | |
| 12. | 746 | 9808 | Notch set to 4 | |
| 13. | 946 | 13442 | Notch set to 0 | |
| 14. | 946 | 13442 | 7 psi brake pipe reduction | |
| 15. | 976 | 13862 | 15 psi brake pipe reduction | |
| 16. | 1007 | 14076 | Train stops | |
| 17. | 1176 | 14076 | Notch changed from 0 to 2 | Brakes are still on |
| 18. | 1176 | 14076 | Brake release | The pressure starts to build in brake pipe. |
| 19. | 1180 | 14078 | Train stops | Train moves 3 feet and stops because brakes are not released yet. |
| 20. | 1184 | 14078 | Train start moving | Brakes are releasing gradually |
| 21. | 1206 | 14088 | Notch changed from 2 to 8 | |
| 22. | 2006 | 45382 | Notch set to 0 | Speed is 47.68 MPH |
| 23. | 2006 | 45382 | Brake pipe reduction of 26 psi (full service application) | |
| 24. | 2109 | 49609 | Train stops | Stopping distance is 4227 feet. |

In accordance with the above table, FIG. 3 shows that before the second 1400, the predicted stopping distance differs from the real value by more than ±25%. Starting with the second 1447, after traveling 20336 feet, from the previously collected data, the model predicts the stopping distance that will occur at second 2008, with an error smaller than +5%. After the second 1521, the stopping distance is predicted with an error smaller than +2%. Between time 1850 and 2000, the error of predicted stopping distance has variations between +5% and +12%. As the predicted event become closer, the error of the prediction becomes smaller than +10%. As the full service brake is applied, the error drops to −4%. Those variations in prediction accuracy are caused by the fact that the ATM determines the best approximation for the already collected data corresponding to past events, with the assumption that such data are representative for future events. When passed events do not provide enough information or are not similar with the future events, the prediction is not very accurate.

Analyzing the variation of all model coefficients determined between time 1400 and 2000, it is seen that predictions made between seconds 1520 and 1850, which are closer to 100%, are made using a set of coefficients that do not properly predict the variation of acceleration when the railcar brakes are fully applied at second 2006. Although the acceleration variation is not perfectly modeled, the estimation errors compensate for each other and the whole prediction provides a very accurate stopping distance.

Figure 4:
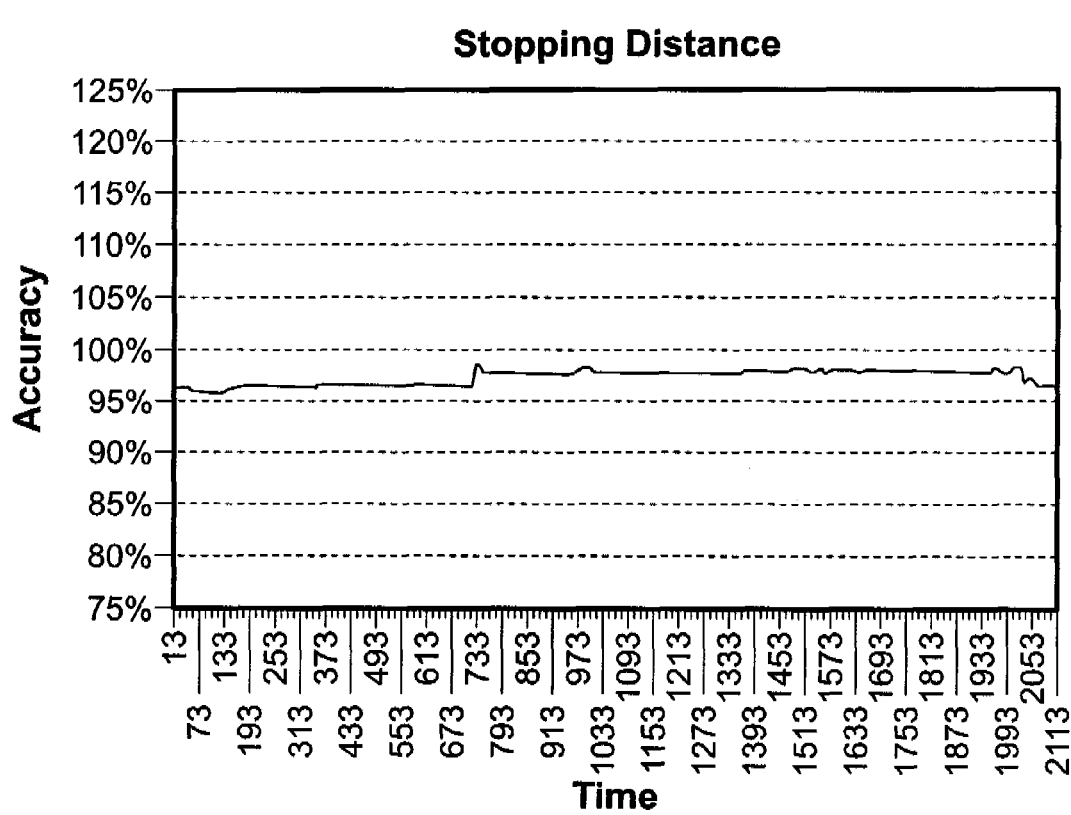
FIG. 4 is a chart depicting the stopping distances for a consist determined by the ATM using initial values previously collected.

FIG. 4 is a chart, for a second exemplary embodiment, showing the stopping distances determined on a consist having two locomotives, 50 loaded railcars and 51 empty railcars, using information collected in the previous embodiment. Thus, the ATM is not started from zero. The accuracy of the predicted stopping distance for the full brake application at second 2006, is shown in FIG. 4.

Since the model already has data about stopping the train with a full service brake application, the stopping distance is determined having an error between −4.2% and −2.7%.

Thus, the data collected by a train consist during one trip can be used as initial data for the ATM when the consist makes another trip with the same amount of load. For example, consists moving ore or coal perform the same trip again and again with the same consists, loaded with almost the same amount of ore in one direction and always empty in other direction.

Figure 5:
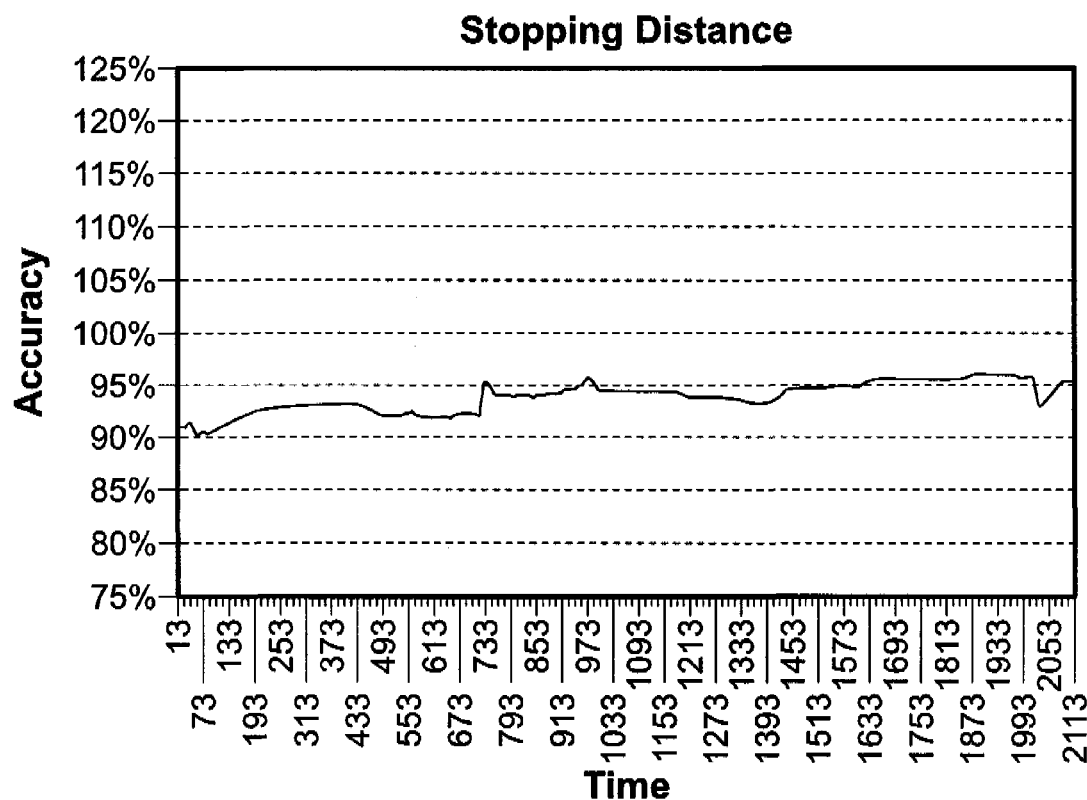
FIG. 5 is a chart depicting the stopping distances for a consist determined by the ATM using information collected for the consist on a prior trip where the load was different from the present load.

FIG. 5 is a chart, for a third exemplary embodiment, depicting the stopping distances determined on a consist having two locomotives, 50 loaded railcars and 51 empty railcars, using information collected for the consist on a prior trip where the load was different from the present load. FIG. 5 presents the variation of the predicted stopping distance when the model is initialized with data collected by another train that is 5% heavier and its measured stopping distance is 35% shorter.

Despite those differences, the stopping distance is predicted with errors only between −4% and −10%. This range of errors is caused because although some of the initialization information was useful, it also included data that does not fit the characteristics of the consist being characterized.

Figure 6:
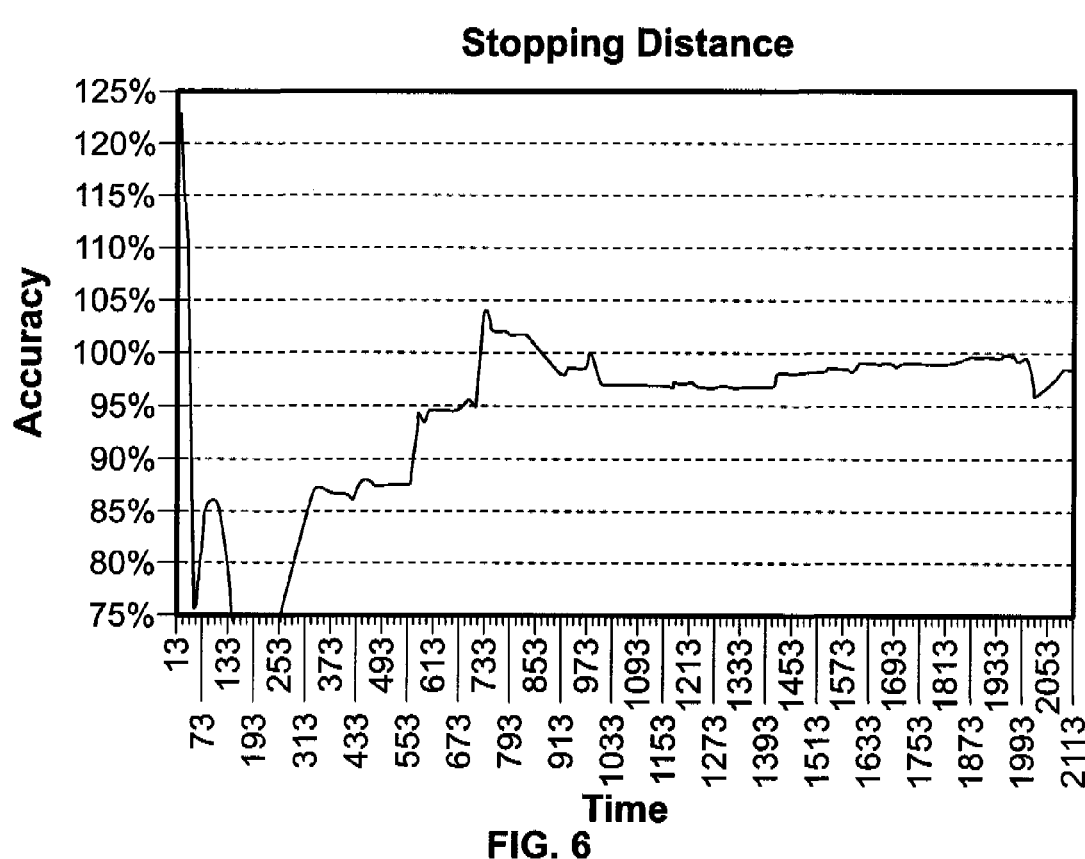
FIG. 6 is a chart depicting variations of the predicted stopping distance for a consist determined by the ATM using as initialization information only some of the data collected based on values from a prior consist.

FIG. 6 is a chart for a fourth exemplary embodiment, based on a consist having two locomotives, 50 loaded railcars and 51 empty railcars. FIG. 6 presents the variation of the predicted stopping distance determined with the ATM using as initialization information only some of the data collected based on values from a prior consist. More particularly, only data collected during the 300 second period that includes a full service application were used. Thus, the model makes very good predictions of the stopping distance after collecting data about the new consist for less than 10 minutes.

When the brakes are applied at second 685, the new information associated with this event helps to improve the quality of prediction of the stopping that is about 1400 seconds away at the time.

Looking at the variation of the prediction after second 2000, when the full service brake is actually applied, the quality of prediction first goes down from 100% to 96%, then, as the model acquired new data about train reaction to a full service brake, the quality moved up to 99%. Such variation is characteristic to models that improve the quality of coefficients. Since the previous prediction was 100%, it means that the global prediction was good, while the acceleration variation during the stopping was less accurate.

Figure 7:
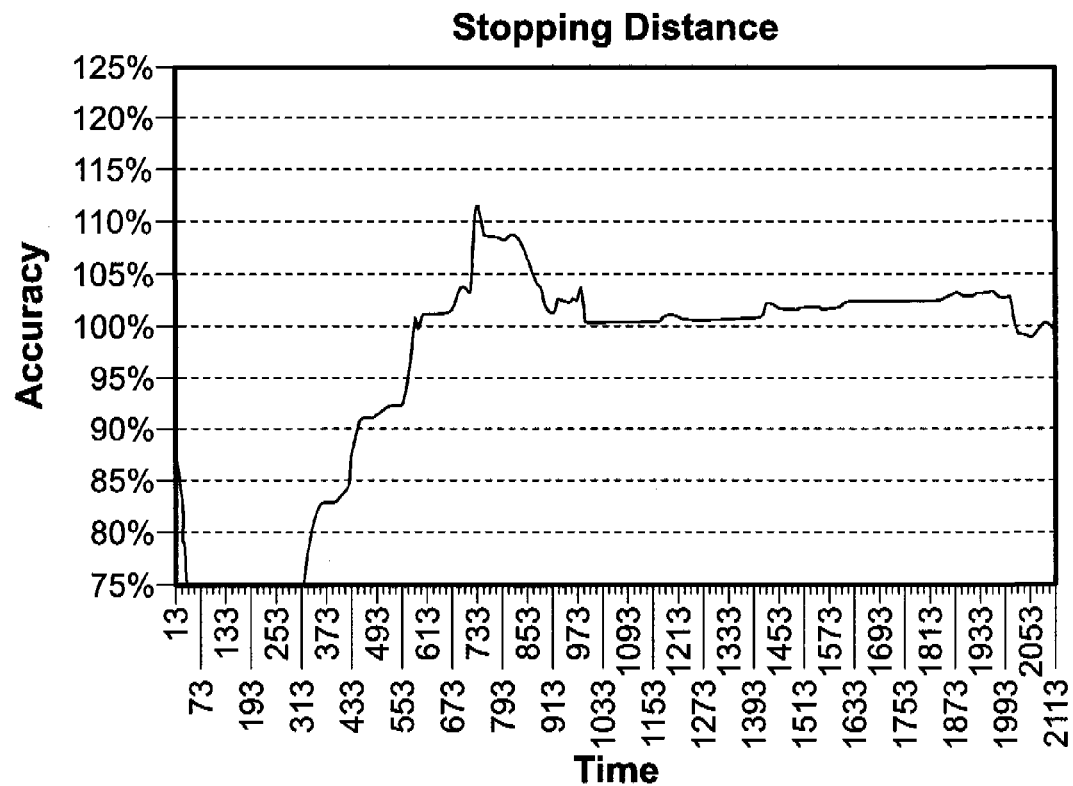
FIG. 7 is a chart depicting the predicted stopping distance for a consist determined by the ATM using modified initial data.

FIG. 7 is a chart, for a fifth exemplary embodiment, based on a consist having two locomotives, 50 loaded railcars and 51 empty railcars. FIG. 7 presents the prediction of the same stopping distance using modified initial data. Before being used for initialization, the data are adjusted according to the difference of weight between the two consists. With this new initial data, the prediction is much closer to the real stopping distance than in previous determinations. At the end of the period, as the model acquires new data, the prediction line approaches the 100% level.

In FIGS. 3 through 7, the predictions presented are of the stopping distance associated with full brake application that happens at the end of the 2006 second period. However, the ATM is capable of providing the stopping distance as the brakes are applied.

Figure 8:
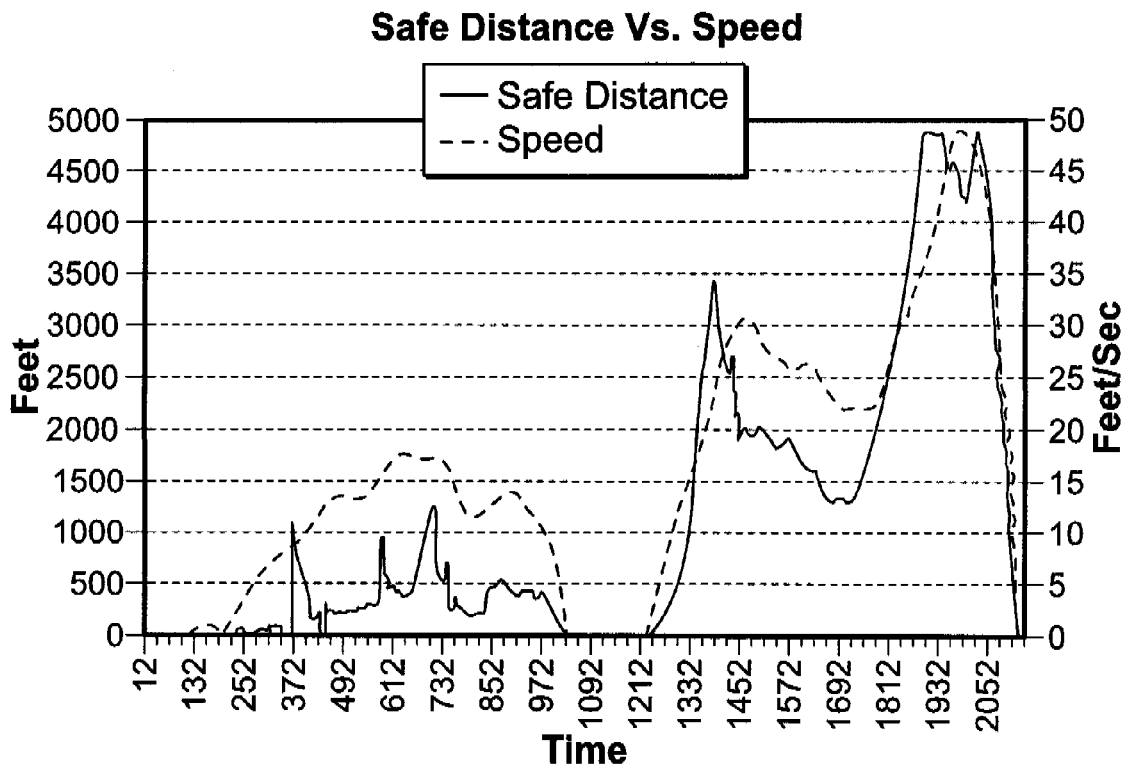
FIG. 8 is a chart depicting the predicted stopping distance determined by the ATM for the stopping distance for a consist as the brakes are fully applied instantly, using no initialization values.

FIG. 8 is a chart, for a sixth exemplary embodiment, based on a consist having two locomotives, 50 loaded railcars and 51 empty railcars. FIG. 8 presents the predictions of the stopping distance as the brakes are fully applied instantly. In other words, it is the safest distance between two consists following each other on the same track. The predictions of the safe distance are made using a model that is not initialized.

Figure 9:
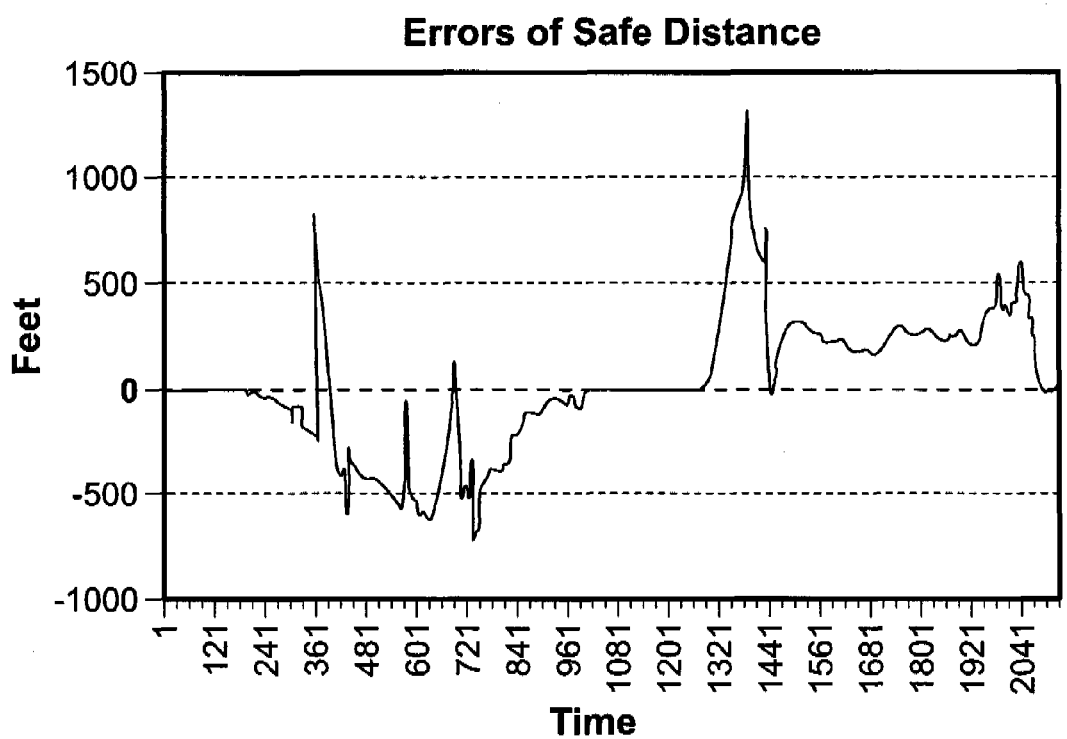
FIG. 9 is a chart depicting variations of the predicted stopping distance determined with the ATM using initialization information based on data collected after three trips on the same track, and using the predictions made on the third trip as references.

FIG. 9 is a chart, for a seventh exemplary embodiment, based on a consist having two locomotives, 50 loaded railcars and 51 empty railcars. FIG. 9 presents the variation of the predicted stopping distance determined with the ATM using initialization information based on data collected after three trips on the same track, and using the predictions made on the third trip as references. The difference between the safe distance predicted by the ATM that has no initial data and predictions made on the third pass of the train on the same track are shown. The variation of errors for the non-initialized model is between −725 and 1335 feet.

Figure 10:
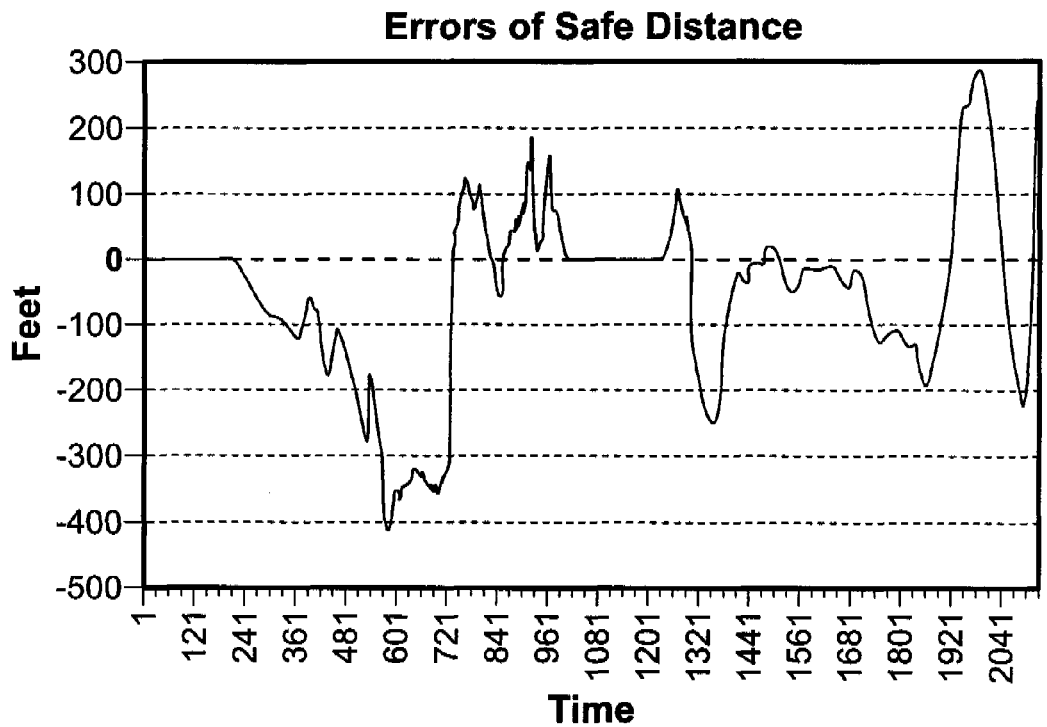
FIG. 10 is a chart depicting an error of an estimated safe stopping distance for a consist using the ATM initialized with weighted information.

FIG. 10 is a chart, for an eighth exemplary embodiment, based on a consist having two locomotives, 50 loaded railcars and 51 empty railcars. FIG. 10 presents the error of the estimated safe distance for the model initialized with weighted information. The variation of errors is between −410 and 268 feet.

Model Database

Referring to FIG. 1, the data collected by the ATM running on a consist is stored in database 16 from where it is retrieved and used as initial data to another consist with the same or close structure. Database 16 is accessed on the keys, such as, number of locomotives, locomotive type, number of railcars, train length (feet), train weight (tons), and load distribution along the consist.

While the invention has been described in terms of various specific embodiments, those skilled in the art will recognize that the invention can be practiced with modification within the spirit and scope of the claims.

What is claimed is:

1. A method for predicting train consist reactions to specific stimuli using a system including at least one measurement sensor located on a train consist, a data base, and a computer, the train consist including at least one locomotive and at least one railcar, said method comprising the steps of:
  collecting sensor data as the consist is moving;
  determining a consist force balance utilizing the sensor data and the computer;
  determining a set of consist coefficients using the computer; and
  predicting train consist kinetic characteristic values using the consist force balance and the set of consist coefficients including:
    determining an acceleration prediction;
    determining a speed after one minute prediction using the acceleration prediction; and
    determining a shortest braking distance prediction using the acceleration prediction.

2. A method in accordance with claim 1 wherein said step of collecting sensor data comprises the steps of:
  monitoring a force applied to the consist utilizing the at least one measurement sensor;
  generating force data with respect to the force applied; and
  communicating the force data to the computer.

3. A method in accordance with claim 1 wherein said step of determining a consist force balance comprises the step of determining a set of consist kinetic elements.

4. A method in accordance with claim 3 wherein said step of determining a set of consist kinetic elements comprises the step of determining rolling forces according to the equation:

$$F_{(rf)} = M(K_r + K_{rv}v(t))$$

wherein
$F_{(rf)}$ relates to the rolling forces of the train;
M is the total train mass;
$K_r$ is the corrective factor for friction of the train;
$K_{rv}$ is the dynamic corrective factor for friction of the train; and
v(t) is the speed of the train as a function of time.

5. A method in accordance with claim 3 wherein said step of determining a set of consist kinetic elements further comprises the step of determining aerodynamic forces according to the equation:

$$F_{(af)} = K_a v(t)^2$$

wherein
$F_{(af)}$ relates to the aerodynamic forces of the train;
$K_a$ is the corrective factor for the effect of the aerodynamic friction; and
v(t) is the speed of the train as a function of time.

6. A method in accordance with claim 3 wherein said step of determining a set of consist kinetic elements further comprises the step of determining elevation caused forces according to the equation:

$$F_{(ef)} = M(K_{e1}E_1(t) + K_{e2}E_2(t) + K_{e3}E_3(t) + K_{e4}E_4(t))$$

wherein
$F_{(ef)}$ relates to the elevation caused forces of the train;
M is the total train mass;
$K_{e1}$ is the corrective factor for the effect of the elevation change on a first segment of the train;
$E_1(t)$ is the elevation function relating to the first segment;
$K_{e2}$ is the corrective factor for the effect of the elevation change on a second segment of the train;
$E_2(t)$ is the elevation function relating to the second segment;
$K_{e3}$ is the corrective factor for the effect of the elevation change on a third segment of the train;
$E_3(t)$ is the elevation function relating to the third segment;
$K_{e4}$ is the corrective factor for the effect of the elevation change on a fourth segment of the train; and
$E_4(t)$ is the elevation function relating to the fourth segment.

7. A method in accordance with claim 3 wherein said step of determining a set of consist kinetic elements further comprises the step of determining braking forces caused by direction changes according to the equation:

$$F_{(dbf)} = M(K_p C_p(t) + K_1 C_1(t))$$

wherein
$F_{(dbf)}$ relates to the dynamic braking force of the train;
M is the total train mass;
$K_p$ is the corrective factor for the weight increase of the train;
$C_p(t)$ is the braking effect caused by the weight increase;
$K_1$ is the corrective factor for the effect of the lateral friction of the train; and
$C_1(t)$ is the braking effect caused by the lateral friction.

8. A method in accordance with claim 3 wherein the at least one railcar includes at least one brake shoe, said step of determining a set of consist kinetic elements further comprises the step of determining consist brake forces caused by application of the at least one brake shoe according to the equation:

$$F_{(baf)} = K_{b1}B_1(t) + K_{b2}B_2(t) + K_{b3}B_3(t) + K_{b4}B_4(t)$$

wherein
$F_{(baf)}$ relates to the applied braking forces of the train;
$K_{b1}$ is the brake function coefficient relating to a first segment of the train;
$B_1(t)$ is the brake function relating to the first segment;
$K_{b2}$ is the brake function coefficient relating to a second segment of the train;
$B_2(t)$ is the brake function relating to the second segment;
$K_{b3}$ is the brake function coefficient relating to a third segment of the train;
$B_3(t)$ is the brake function relating to the third segment;
$K_{b4}$ is the brake function coefficient relating to a fourth segment of the train; and
$B_4(t)$ is the brake function relating to the fourth segment.

9. A method in accordance with claim 8 wherein said step of determining consist brake forces caused by application of the at least one brake shoe further comprises the steps of:
  determining friction coefficients of the at least one brake shoe;
  determining total brake application forces; and
  determining total brake release forces.

10. A method in accordance with claim 9 wherein said step of determining total brake application forces comprises the step of determining a brake application dragging force using a fast building pressure model according to the equation:

$$Bf_f = \min(0, \max(1, (T + 3.86950758 * T^2 + 0.23164628 * T^3) / (16367.9101 + 111.652789 * T + 27.61345048 * T^2 - 0.0026229 * T^3))) Bc_f$$

wherein
$Bf_f$ is the braking force of the train for fast building pressure;
T is the traction force of the train; and
$Bc_f$ is the brake cylinder force of the train.

11. A method in accordance with claim 9 wherein said step of determining total brake application forces comprises the step of determining a brake application dragging force using a slow building pressure model according to the equation:

$$Bf_s=\min(0,\max(1,(T_s+2.00986206*T_s^2+0.81412194*T_s^3)/(0.00067603+169.361303*T_s+8.95254599*T_s^2+0.58477705*T_s^3)))Bc_s$$

wherein
$Bf_s$ is the braking force of the train for slow building pressure;
$T_s$ is the traction force for the slow building pressure; and
$Bc_s$ is the brake cylinder force of the train.

12. A method in accordance with claim 9 wherein said step of determining total brake release forces comprises the step of determining brake release using a fast release model according to the equation:

$$Rf_f=\min(0,\max(1,(t+3.86950758*t^2+0.23164628*t^3)/(16367.9101+111.652789*t+27.61345048*t^2-0.0026229*t^3)))Bc_f$$

wherein
$Rf_f$ relates to the fast release force of the train;
t is the time; and
$Bc_f$ is the brake cylinder force of the train.

13. A method in accordance with claim 9 wherein said step of determining total brake release forces comprises the step of determining brake release using a slow release model according to the equation:

$$Rf_s=\min(0,\max(1,(t+2.00986206*t^2+0.81412194*t^3)/(0.00067603+169.361303*t+8.95254599*t^2+0.58477705*t^3)))Bc_s$$

wherein
$Rf_s$ relates to the slow release force of the train;
t is the time; and
$Bc_s$ is the brake cylinder force of the train.

14. A method in accordance with claim 3 wherein said step of determining a set of consist kinetic elements further comprises the step of determining dynamic brake force according to the equation:

$$F_{(dbf)}=K_dD(t)$$

wherein
$F_{(dbf)}$ relates to the dynamic brake force;
$K_d$ is the corrective factor for the effect of the dynamic brake application; and
D(t) is the dynamic brake force of the train.

15. A method in accordance with claim 3 wherein said step of determining a set of kinetic elements further comprises the step of determining traction force.

16. A method in accordance with claim 3 wherein said step of determining a force balance further comprises the step of summing the set of consist kinetic elements.

17. A method in accordance with claim 1 wherein said step of determining a set of consist coefficients comprises the step of using a least squares method to determine consist coefficients.

18. A method in accordance with claim 17 wherein said step of using the least squares method comprises the steps of:
weighting data;
solving the system; and
determining a confidence measure.

19. A method in accordance with claim 1 wherein said step of determining an acceleration prediction comprises the steps of:
determining initial values; and
storing the initial values in the database.

20. A method in accordance with claim 19 wherein said step of determining an acceleration prediction further comprises the step of determining the acceleration prediction value using a Euler method and the determined initial values.

21. A method in accordance with claim 19 wherein said step of determining an acceleration prediction further comprises the step of determining the acceleration prediction value using a Milne method and the determined initial values.

22. A system for predicting reactions of a train consist to specific stimuli, said system comprising at least one measurement sensor located on the train consist, a data base, and a computer, the train consist comprising at least one locomotive and at least one railcar, said system configured to:
collect sensor data as the consist is moving;
determine a consist force balance utilizing the sensor data and said computer;
determine a set of consist coefficients using said computer; and
predict train consist kinetic characteristic values using the consist force balance and the set of consist coefficients wherein the system is configured to:
determine an acceleration prediction;
determine a speed after one minute prediction using said acceleration prediction; and
determine a shortest braking distance prediction using said acceleration prediction.

23. A system in accordance with claim 22 wherein to collect sensor data said system further configured to:
monitor a force applied to the consist utilizing said at least one measurement sensor;
generate force data with respect to the force applied; and
communicate the force data to said computer.

24. A system in accordance with claim 22 wherein to determine a consist force balance, said system further configured to determine a set of consist kinetic elements.

25. A system in accordance with claim 24 wherein to determine a set of consist kinetic elements, said system further configured to determine rolling forces according to the equation:

$$F_{(rf)}=M(K_r+K_{rv}v(t))$$

wherein
$F_{(rf)}$ relates to the rolling forces of the train;
M is the total train mass;
$K_r$ is the corrective factor for friction of the train;
$K_{rv}$ is the dynamic corrective factor for friction of the train; and
v(t) is the speed of the train as a function of time.

26. A system in accordance with claim 24 wherein to determine a set of consist kinetic elements, said system further configured to determine aerodynamic forces according to the equation:

$$F_{(af)}=K_av(t)^2$$

wherein
$F_{(af)}$ relates to the aerodynamic forces of the train;
$K_a$ is the corrective factor for the effect of the aerodynamic friction; and
v(t) is the speed of the train as a function of time.

27. A system in accordance with claim 24 wherein to determine a set of consist kinetic elements, said system further configured to determine elevation caused forces according to the equation:

$$F_{(ef)}=M(K_{e1}E_1(t)+K_{e2}E_2(t)+K_{e3}E_3(t)+K_{e4}E_4(t))$$

wherein $F_{(ef)}$ relates to the elevation caused forces of the train;

M is the total train mass;

$K_{e1}$ is the corrective factor for the effect of the elevation change on a first segment of the train;

$E_1(t)$ is the elevation function relating to the first segment;

$K_{e2}$ is the corrective factor for the effect of the elevation change on a second segment of the train;

$E_2(t)$ is the elevation function relating to the second segment;

$K_{e3}$ is the corrective factor for the effect of the elevation change on a third segment of the train;

$E_3(t)$ is the elevation function relating to the third segment;

$K_{e4}$ is the corrective factor for the effect of the elevation change on a fourth segment of the train; and $E_4(t)$ is the elevation function relating to the fourth segment.

28. A system in accordance with claim 24 wherein to determine a set of consist kinetic elements, said system further configured to determine braking forces caused by direction changes according to the equation:

$$F_{(dbf)} = M(K_p C_p(t) + K_1 C_1(t))$$

wherein $F_{(dbf)}$ relates to the dynamic braking force of the train;

M is the total train mass;

$K_p$ is the corrective factor for the weight increase of the train;

$C_p(t)$ is the braking effect caused by the weight increase;

$K_1$ is the corrective factor for the effect of the lateral friction of the train; and $C_1(t)$ is the braking effect caused by the lateral friction.

29. A system in accordance with claim 24 wherein said at least one railcar comprises at least one brake shoe, and to determine a set of consist kinetic elements, said system further configured to determine consist brake forces caused by application of said at least one brake shoe according to the equation:

$$F_{(baf)} = K_{b1} B_1(t) + K_{b2} B_2(t) + K_{b3} B_3(t) + K_{b4} B_4(t)$$

wherein $F_{(baf)}$ relates to the applied braking forces of the train;

$K_{b1}$ is the brake function coefficient relating to a first segment of the train;

$B_1(t)$ is the brake function relating to the first segment;

$K_{b2}$ is the brake function coefficient relating to a second segment of the train;

$B_2(t)$ is the brake function relating to the second segment;

$K_{b3}$ is the brake function coefficient relating to a third segment of the train;

$B_3(t)$ is the brake function relating to the third segment;

$K_{b4}$ is the brake function coefficient relating to a fourth segment of the train; and $B_4(t)$ is the brake function relating to the fourth segment.

30. A system in accordance with claim 29 wherein to determine consist brake forces caused by application of said at least one brake shoe, said system further configured to:

determine friction coefficients of said at least on brake shoe;

determine total brake application forces; and determine total brake release forces.

31. A system in accordance with claim 30 wherein to determine total brake application forces, said system further configured to determine a brake application dragging force using a fast building pressure model according to the equation:

$$Bf_f = \min(0, \max(1, (T + 3.86950758 * T^2 + 0.23164628 * T^3)/(16367.9101 + 111.652789 * T + 27.61345048 * T^2 - 0.0026229 * T^3))) Bc_f$$

wherein $Bf_f$ is the braking force of the train for fast building pressure;

T is the traction force of the train; and $Bc_f$ is the brake cylinder force of the train.

32. A system in accordance with claim 30 wherein to determine total brake application forces, said system further configured to determine a brake application dragging force using a slow building pressure model according to the equation:

$$Bf_s = \min(0, \max(1, (T_s + 2.00986206 * T_s^2 + 0.81412194 * T_s^3)/(0.00067603 + 169.361303 * T_s + 8.95254599 * T_s^2 + 0.58477705 * T_s^3))) Bc_s$$

wherein $Bf_s$ is the braking force of the train for slow building pressure;

$T_s$ is the traction force for the slow building pressure; and $Bc_s$ is the brake cylinder force of the train.

33. A system in accordance with claim 30 wherein to determine total brake release forces, said system further configured to determine brake release using a fast release model according to the equation:

$$Rf_f = \min(0, \max(1, (t + 3.86950758 * t^2 + 0.23164628 * t^3)/(16367.9101 + 111.652789 * t + 27.61345048 * t^2 - 00026229 * t^3))) Bc_f$$

wherein $Rf_f$ relates to the fast release force of the train;

t is the time; and $Bc_f$ is the brake cylinder force of the train.

34. A system in accordance with claim 30 wherein to determine total brake release forces, said system further configured to determine brake release using a slow release model according to the equation:

$$Rf_s = \min(0, \max(1, (t + 2.00986206 * t^2 + 0.81412194 * t^3)/(0.00067603 + 169.361303 * t + 8.95254599 * t^2 + 0.58477705 * t^3))) Bc_s$$

wherein $Rf_s$ relates to the slow release force of the train;

t is the time; and $Bc_s$ is the brake cylinder force of the train.

35. A system in accordance with claim 24 wherein to determine a set of consist kinetic elements, said system further configured to determine dynamic brake force according to the equation:

$$F_{(dbf)} = K_d D(t)$$

wherein $F_{(dbf)}$ relates to the dynamic brake force;

$K_d$ is the corrective factor for the effect of the dynamic brake application; and $D(t)$ is the dynamic brake force of the train.

36. A system in accordance with claim 24 wherein to determine a set of kinetic elements, said system further configured to determine traction force.

37. A system in accordance with claim 24 wherein to determine a force balance, said system further configured to sum said set of consist kinetic elements.

38. A system in accordance with claim 22 wherein to determine a set of consist coefficients, said system further configured to use a least squares method to determine consist coefficients.

39. A system in accordance with claim 38 wherein to use the least squares, said system further configured to:
weight data;
solve the system; and
determine a confidence measure.

40. A system in accordance with claim 22 wherein to determine an acceleration prediction, said system further configured to:
determine initial values; and
store the initial values in said database.

41. A system in accordance with claim 40 wherein to determine an acceleration prediction, said system further configured to determine the acceleration prediction value using a Euler method and said determined initial values.

42. A system in accordance with claim 19 wherein to determine an acceleration prediction, said system further configured to determine the acceleration prediction value using a Milne method and the determined initial values.

43. A method for determining a force balance for a train consist using a system including at least one measurement sensor located on the train consist, a data base, and a computer, the train consist including at least one locomotive and at least one railcar, the railcar including at least one brake shoe, said method comprising the steps of:

monitoring a force applied to the consist utilizing the at least one measurement sensor;

generating force data with respect to the force applied;

communicating the force data to the computer;

determining rolling forces according to the equation $F_{(rf)} = M(K_r + K_{rv} v(t))$, determining aerodynamic forces according to the equation $F_{(af)} = K_a v(t)^2$, determining elevation caused forces according to the equation $F_{(ef)} = M(K_{e1} E_1(t) + K_{e2} E_2(t) + K_{e3} E_3(t) + K_{e4} E_4(t))$, determining braking forces caused by direction changes according to the equation $F_{(dbf)} = M(K_p C_p(t) + K_1 C_1(t))$;

determining consist brake forces caused by application of the at least one brake shoe according to the equation $F_{(baf)} = K_{b1} B_1(t) + K_{b2} B_2(t) + K_{b3} B_3(t) + K_{b4} B_4(t)$;

determining brake application dragging force using a fast building pressure model according to the equation:

$Bf_f = \min(0, \max(1, (T + 3.86950758 * T^2 + 0.23164628 * T^3)/(16367.9101 + 111.652789 * T + 27.61345048 * T^2 - 0.0026229 * T^3))) Bc_f$;

determining brake application dragging force using a slow building pressure model according to the equation:

$Bf_s = \min(0, \max(1, (T_s + 2.00986206 * T_s^2 + 0.81412194 * T_s^3)/(0.00067603 + 169.361303 * T_s + 8.95254599 * T_s^2 + 0.58477705 * T_s^3))$;

determining brake release using a fast release model according to the equation:

$Rf_f = \min(0, \max(1, (t + 3.86950758 * t^2 + 0.23164628 * t^3)/(16367.9101 + 111.652789 * t + 27.61345048 * t^2 - 0.0026229 * t^3))) Bc_f$;

determining brake release using a slow release model according to the equation:

$Rf_s = \min(0, \max(1, (t + 2.00986206 * t^2 + 0.81412194 * t^3)/(0.00067603 + 169.361303 * t + 8.95254599 * t^2 + 0.58477705 * t^3))) Bc_s$;

determining dynamic brake force according to the equation $F_{(dbf)} = K_d D(t)$, determining traction force; and determining a final solution according to the equation:

$F(t) = M(K_r + K_{rv} v(t)) + K_a v(t)^2 +$ $MK_{e1} E_1(t) + MK_{e2} E_2(t) + MK_{e3} E_3(t) + MK_{e4} E_4(t) +$ $MK_p C_p(t) + MK_1 C_1(t) +$ $K_{b1} B_1(t) + K_{b2} B_2(t) + K_{b3} B_3(t) + K_{b4} B_4(t) +$ $K_{r1} R_1(t) + K_{r2} R_2(t) + K_{r3} R_3(t) + K_{r4} R_4(t) + K_d D(t) + K_t T(t)$ wherein
$F_{(rf)}$ relates to the rolling forces of the train;
M is the total train mass;
$K_r$ is the corrective factor for friction of the train;
$K_{rv}$ is the dynamic corrective factor for friction of the train;
v(t) is the speed of the train as a function of time;
$F_{(af)}$ relates to the aerodynamic forces of the train;
$K_a$ is the corrective factor for the effect of the aerodynamic friction;
$F_{(ef)}$ relates to the elevation caused forces of the train;
$K_{e1}$ is the corrective factor for the effect of the elevation change on a first segment of the train;
$E_1(t)$ is the elevation function relating to the first segment;
$K_{e2}$ is the corrective factor for the effect of the elevation change on a second segment of the train;
$E_2(t)$ is the elevation function relating to the second segment;
$K_{e3}$ is the corrective factor for the effect of the elevation change on a third segment of the train;
$E_3(t)$ is an elevation function relating to the third segment;
$K_{e4}$ is the corrective factor for the effect of the elevation change on a fourth segment of the train;
$E_4(t)$ is an elevation function relating to the fourth segment;
$F_{(dbf)}$ relates to the dynamic braking force of the train;
$K_p$ is the corrective factor for the weight increase of the train;
$C_p(t)$ is the braking effect caused by the weight increase;
$K_1$ is the corrective factor for the effect of the lateral friction of the train;
$C_1(t)$ is the braking effect caused by the lateral friction;
$F_{(baf)}$ relates to the applied braking forces of the train;
$K_{b1}$ is the brake function coefficient relating to a first segment of the train;
$B_1(t)$ is the brake function relating to the first segment;
$K_{b2}$ is the brake function coefficient relating to a second segment of the train;
$B_2(t)$ is the brake function relating to the second segment;
$K_{b3}$ is the brake function coefficient relating to a third segment of the train;
$B_3(t)$ is the brake function relating to the third segment;
$K_{b4}$ is the brake function coefficient relating to a fourth segment of the train;
$B_4(t)$ is the brake function relating to the fourth segment;
$Bf_f$ is the braking force of the train for fast building pressure;
T is the traction force of the train;
$Bc_f$ is the brake cylinder force of the train;
$Bf_s$ is the braking force of the train for slow building pressure;
$T_s$ is the traction force for the slow building pressure;
$Bc_s$ is the brake cylinder force of the train;
$Rf_f$ relates to the fast release force of the train;

t is the time;

$Rf_s$ relates to the slow release force of the train;

$F_{(dbf)}$ relates to the dynamic brake force;

$K_d$ is the corrective factor for the effect of the dynamic brake application;

$D(t)$ is the dynamic brake force of the train;

$F(t)$ is the force balance of the train;

$K_{r1}$ is the corrective factor for friction in the first segment of the train;

$R_1(t)$ is the release function of the first segment;

$K_{r2}$ is the corrective factor for friction in the second segment of the train;

$R_2(t)$ is the release function of the second segment;

$K_{r3}$ is the corrective factor for friction in the third segment of the train;

$R_3(t)$ is the release function of the third segment;

$K_{r4}$ is the corrective factor for friction in the fourth segment of the train;

$R_4(t)$ is the release function of the fourth segment; and $K_d$ is the corrective factor for the effect of the dynamic brake application.

\* \* \* \* \*